United States Patent
Vemuri et al.

(10) Patent No.: US 12,230,604 B2
(45) Date of Patent: Feb. 18, 2025

(54) PACKAGE COMPRISING STACKED INTEGRATED DEVICES WITH OVERHANG

(71) Applicant: QUALCOMM Incorporated, San Diego, CA (US)

(72) Inventors: Krishna Vemuri, San Diego, CA (US); Jinseong Kim, Escondido, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 274 days.

(21) Appl. No.: 17/375,931

(22) Filed: Jul. 14, 2021

(65) Prior Publication Data

US 2023/0019333 A1   Jan. 19, 2023

(51) Int. Cl.
*H01L 25/065*    (2023.01)
*H01L 25/00*     (2006.01)

(52) U.S. Cl.
CPC ...... *H01L 25/0652* (2013.01); *H01L 25/0657* (2013.01); *H01L 25/50* (2013.01); *H01L 2225/06517* (2013.01); *H01L 2225/06548* (2013.01); *H01L 2225/06562* (2013.01); *H01L 2225/06572* (2013.01); *H01L 2225/06586* (2013.01)

(58) Field of Classification Search
CPC ............. H01L 25/0652; H01L 25/0657; H01L 2225/06517; H01L 2225/06548; H01L 2225/06562; H01L 225/06572; H01L 2225/06586; H01L 24/13; H01L 24/16; H01L 24/32; H01L 24/81; H01L 2224/32145
See application file for complete search history.

(56) References Cited

U.S. PATENT DOCUMENTS

| | | | |
|---|---|---|---|
| 9,312,198 B2* | 4/2016 | Meyer | H01L 24/24 |
| 2011/0042798 A1* | 2/2011 | Pagaila | H01L 23/49575 |
| | | | 257/E21.705 |
| 2013/0009303 A1 | 1/2013 | Tsai et al. | |
| 2017/0345761 A1* | 11/2017 | Yu | H01L 24/20 |
| 2020/0006293 A1* | 1/2020 | Sankman | H01L 24/16 |
| 2020/0006305 A1* | 1/2020 | Lambert | H01L 24/16 |
| 2020/0273800 A1 | 8/2020 | Kim et al. | |
| 2020/0312774 A1* | 10/2020 | Yu | H01L 25/0657 |

OTHER PUBLICATIONS

International Search Report and Written Opinion—PCT/US2022/033003—ISA/EPO—Sep. 29, 2022.

* cited by examiner

*Primary Examiner* — Thanh Y. Tran
(74) *Attorney, Agent, or Firm* — Loza & Loza, LLP

(57) ABSTRACT

A package that includes a substrate, a first integrated device coupled to the substrate, and a second integrated device coupled to the first integrated device. A portion of the second integrated device overhangs over the first integrated device. The second integrated device is configured to be coupled to the substrate. The second integrated device includes a front side and a back side. The front side of the second integrated device faces the substrate.

23 Claims, 17 Drawing Sheets

*CROSS SECTIONAL PROFILE VIEW*

*CROSS SECTIONAL PROFILE VIEW*

CROSS SECTIONAL PROFILE VIEW

CROSS SECTIONAL PROFILE VIEW

CROSS SECTIONAL PROFILE VIEW

CROSS SECTIONAL PROFILE VIEW

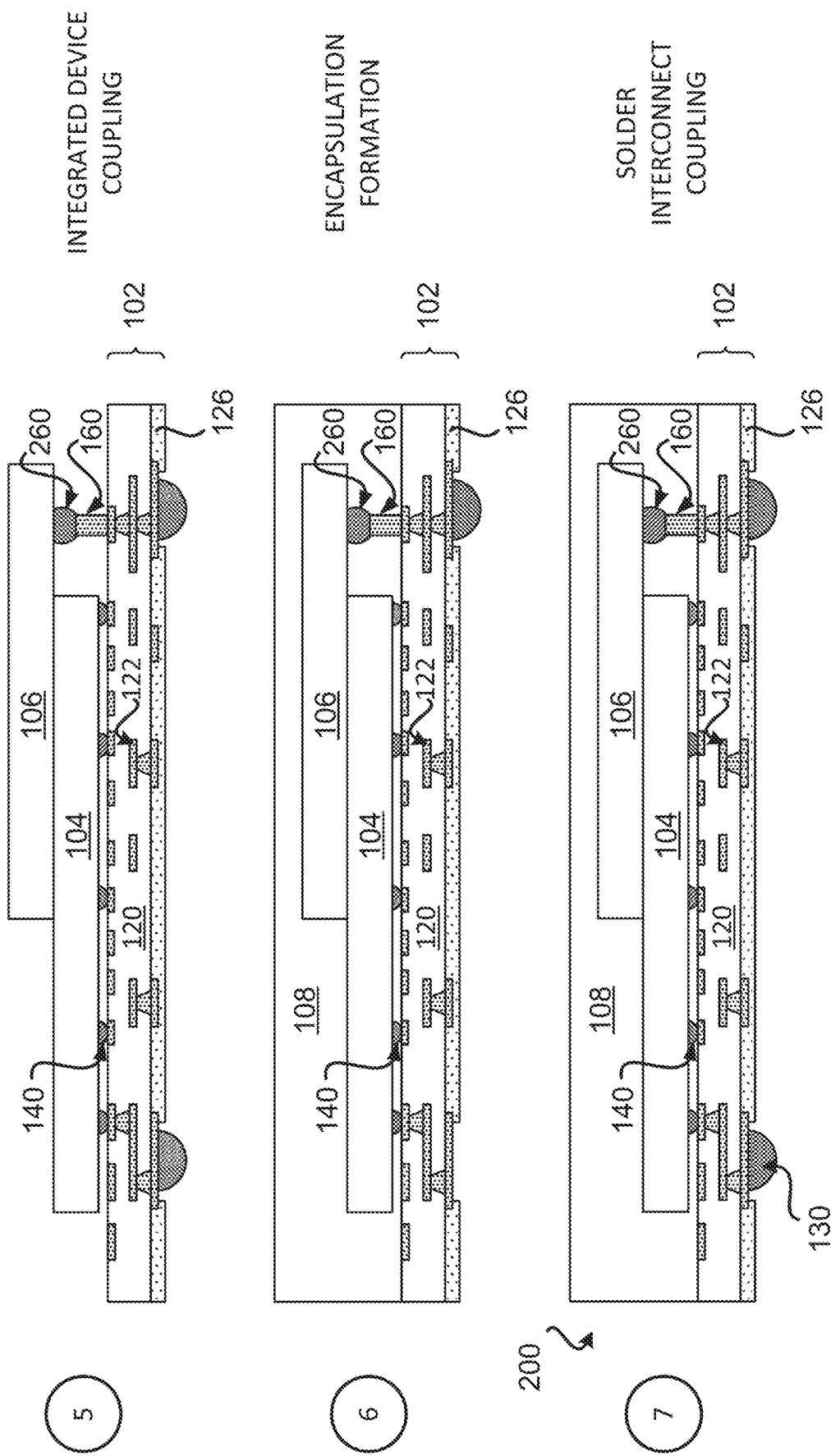

… … US 12,230,604 B2 …

PACKAGE COMPRISING STACKED INTEGRATED DEVICES WITH OVERHANG

FIELD

Various features relate to packages with integrated devices.

BACKGROUND

A package may include a substrate and integrated devices. These components are coupled together to provide a package that may perform various electrical functions. How the integrated devices and the substrate are coupled together affects how the package performs overall. There is an ongoing need to provide better performing packages and reduce the overall size of packages.

SUMMARY

Various features relate to packages with integrated devices.

One example provides a package that includes a substrate, a first integrated device coupled to the substrate, and a second integrated device coupled to the first integrated device. A portion of the second integrated device overhangs over the first integrated device. The second integrated device is configured to be coupled to the substrate. The second integrated device includes a front side and a back side. The front side of the second integrated device faces the substrate.

Another example provides an apparatus that includes a substrate, a first integrated device coupled to the substrate, and a second integrated device coupled to the first integrated device. A portion of the second integrated device overhangs over the first integrated device. The second integrated device is configured to be coupled to the substrate. The second integrated device includes a front side and a back side. The front side of the second integrated device faces the substrate.

Another example provides a method for fabricating a package. The method provides a substrate. The method couples a first integrated device to the substrate. The method couples a second integrated device to the first integrated device such that a portion of the second integrated device overhangs over the first integrated device. The second integrated device is configured to be coupled to the substrate. The second integrated device includes a front side and a back side. The front side of the second integrated device faces the substrate.

BRIEF DESCRIPTION OF THE DRAWINGS

Various features, nature and advantages may become apparent from the detailed description set forth below when taken in conjunction with the drawings in which like reference characters identify correspondingly throughout.

FIGS. 8A-8B illustrate an exemplary sequence for fabricating a package with stacked integrated devices with overhang.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Figure 1:
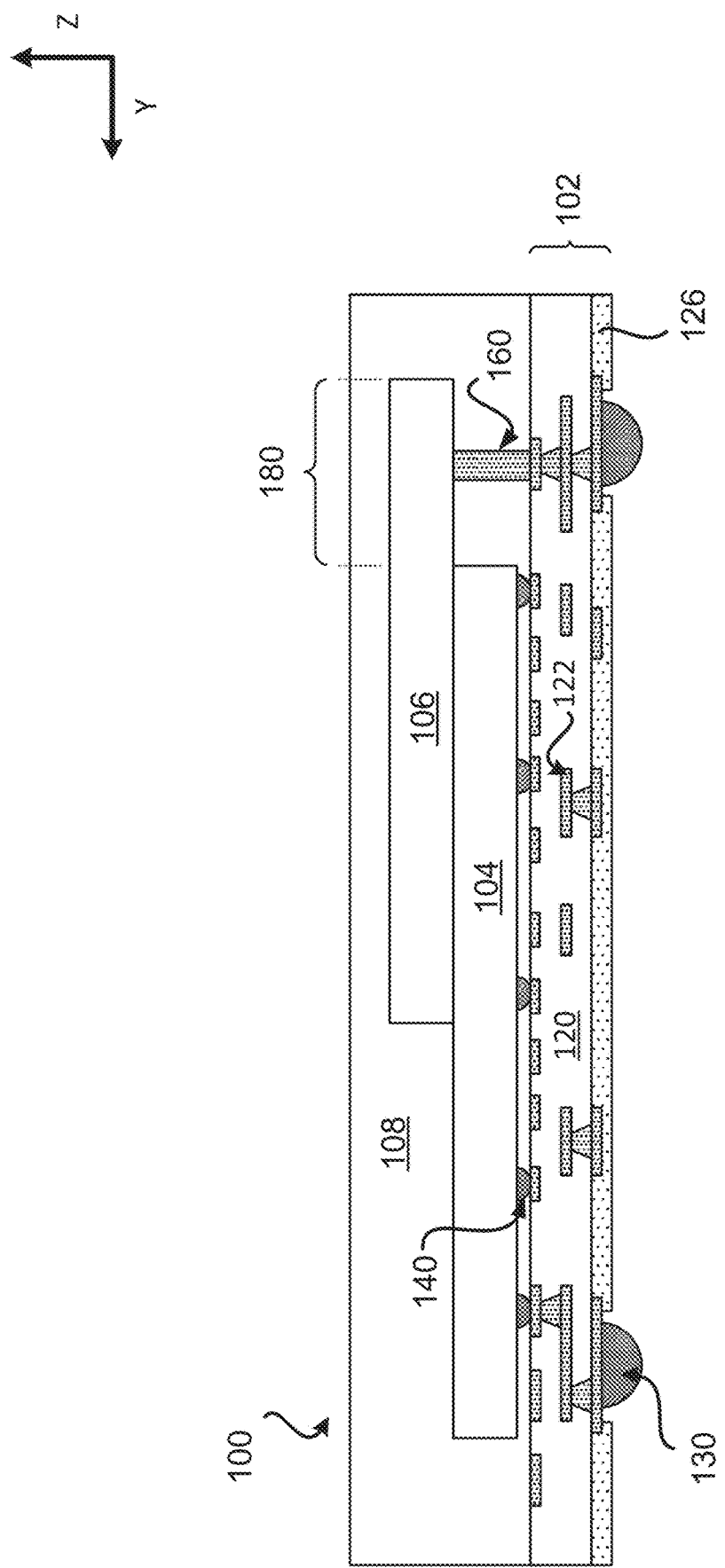
FIG. 1 illustrates a cross sectional profile view of a package that includes stacked integrated devices with overhang.

The present disclosure describes a package that includes a substrate, a first integrated device coupled to the substrate, and a second integrated device coupled to the first integrated device. A portion of the second integrated device overhangs over the first integrated device. The second integrated device is configured to be coupled to the substrate. The second integrated device includes a front side and a back side. The front side of the second integrated device faces the substrate. The second integrated device is coupled to the substrate through at least one pillar interconnect, at least one solder interconnect, and/or an interposer. The package may bypass the use of wire bonds, which helps reduce the overall size of the package and helps improve the performance of the package by reducing the interconnect length between integrated devices. The configuration of the package that includes putting one integrated device over another integrated device may also decrease the size and/or footprint of the package, while still providing improved package performance Exemplary Package Comprising Stacked Integrated Devices with Overhang FIG. 1 illustrates a cross sectional profile view of a package 100 that includes stacked integrated devices with overhang. The package 100 includes a substrate 102, an integrated device 104, an integrated device 106, and an encapsulation layer 108. The integrated device 104 may be a first integrated device. The integrated device 106 may be a second integrated device. The substrate 102 includes at least one dielectric layer 120, a plurality of interconnects 122 and a solder resist layer 126. A plurality of solder interconnects 130 may be coupled to the substrate 102.

The integrated device 104 is coupled to the substrate 102 through a plurality of solder interconnects 140. The integrated device 106 is located over the integrated device 104. The integrated device 106 may be coupled to the integrated device 104 through an adhesive (not shown). A portion 180 of the integrated device 106 may overhang over the integrated device 104. At least one pillar interconnect 160 may be coupled to the substrate 102 and to the front side of the portion 180 of the integrated device 106. The at least one pillar interconnect 160 may be coupled to the plurality of interconnect 122 through at least one solder interconnect (not shown). The integrated device 106 may be coupled to the substrate 102 through at least one pillar interconnect 160. The at least one pillar interconnect 160 may be located between the substrate 102 and the portion 180 of the integrated device 106. The integrated device 106 may be configured to be electrically coupled to the integrated device 104 through the at least one pillar interconnect 160, the plurality of interconnects 122, and/or the plurality of solder interconnects 140. For example, an electrical path for at least one signal between the integrated device 104 and the integrated device 106 may include the at least one pillar interconnect 160, at least one interconnect from the plurality of interconnects 122, and/or at least one solder interconnect from the plurality of solder interconnects 140. In the instance there is solder interconnect between the at least one pillar interconnect 160 and the plurality of interconnects 122, the electrical path may also include the solder interconnect between the at least one pillar interconnect 160 and the plurality of interconnects 122.

The integrated device 104 may include a front side and a back side. Similarly, the integrated device 106 may include a front side and a back side. The front side of the integrated device 104 may face the substrate 102. A back side of an integrated device may include the die substrate (e.g., silicon) side of the integrated device. The front side of the integrated device 106 may face the back side of the integrated device 104 and/or the substrate 102. For example, the front side of the portion 180 of the integrated device 106 may face the substrate 102. The front side of the integrated device 106 may be coupled to the back side of the integrated device 104 (e.g., mechanically coupled through an adhesive).

The encapsulation layer 108 may be located over the substrate 102, the integrated device 104 and the integrated device 106. The encapsulation layer 108 may at least partially encapsulate the integrated device 104, the integrated device 106 and the at least one pillar interconnect 160. The encapsulation layer 108 may include a mold, a resin and/or an epoxy. The encapsulation layer 108 may be a means for encapsulation. The encapsulation layer 108 may be provided by using a compression and transfer molding process, a sheet molding process, or a liquid molding process.

The configuration of the package 100 may help bypass the use of wire bonds. Bypassing the use of wire bonds helps reduce the overall size of the package 100 and helps improve the performance of the package 100 by reducing the interconnect length between integrated devices (e.g., 104, 106). Since the front side of the integrated device 106 faces towards the substrate 102, there is a shorter and more direct electrical path between the substrate 102 the integrated device 106, helping improve signals speed between integrated devices. Packages that use wire bonds may require more space between the integrated device and the edge of the package to accommodate the placement of wire bonds. Since there are no wire bonds needed in the package 100, the edge of the package 100 may be located closer to the edge of the integrated devices (e.g., 104, 106), which helps reduce the overall form factor of the package 100. The same benefits and advantages may also be found for other packages described in the disclosure.

Figure 2:
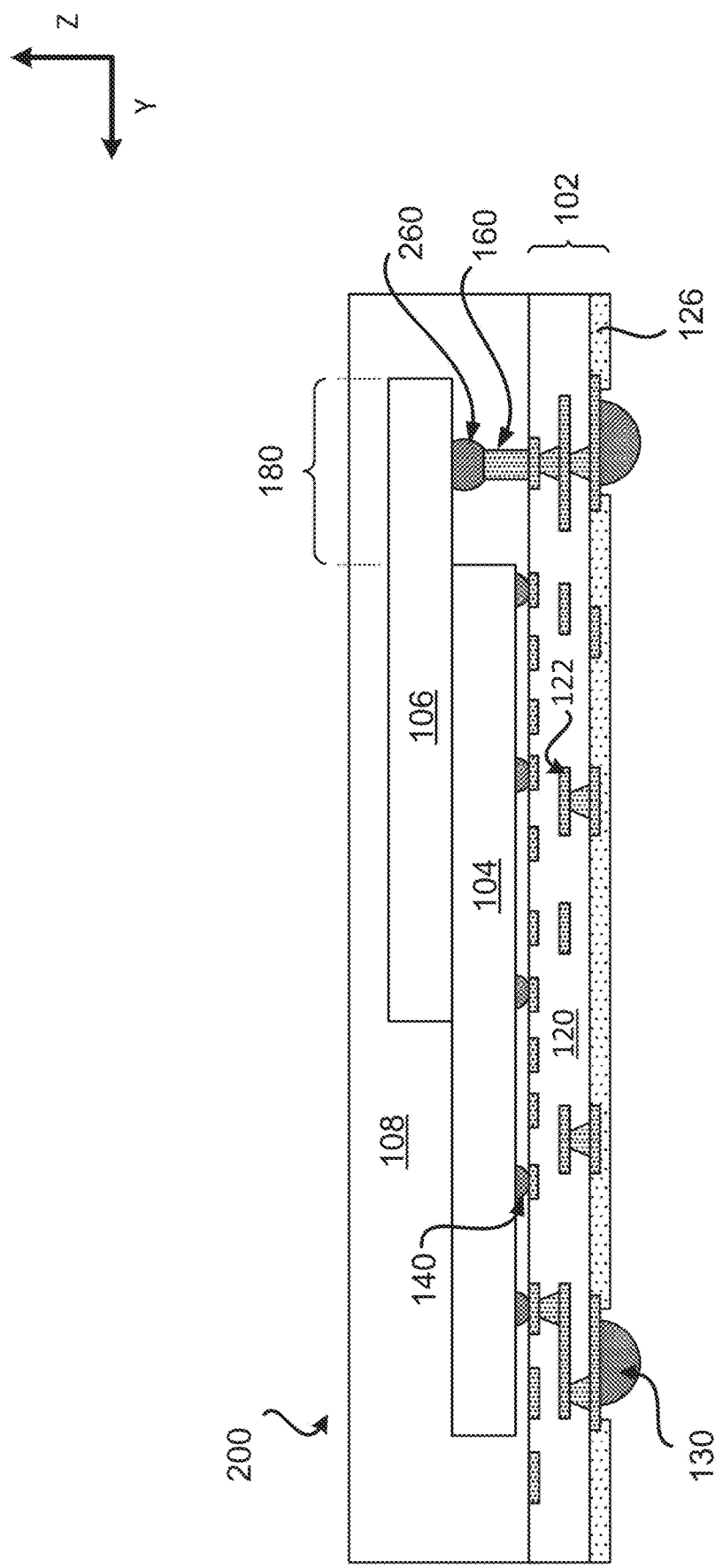
FIG. 2 illustrates a cross sectional profile view of a package that includes stacked integrated devices with overhang.

Different implementations may have packages with different configurations of integrated devices. FIG. 2 illustrates a package 200 that includes stacked integrated devices with overhang. The package 200 is similar to the package 100, and includes similar components, the same components, and/or similar arrangements as the package 100. Thus, the description of the package 100 may be applicable to the package 200. FIG. 2 illustrates that the package 200 includes at least one pillar interconnect 160 and at least one solder interconnect 260. The at least one solder interconnect 260 is coupled to the integrated device 106 and the at least one pillar interconnect 160. The at least one solder interconnect 260 may be coupled to the front side of the portion 180 of the integrated device 106. The at least one pillar interconnect 160 may be coupled to the substrate 102. In some implementations, the at least one pillar interconnect 160 may considered part of the substrate 102. The integrated device 106 may be coupled to the substrate 102 through the at least one solder interconnect 260 and the at least one pillar interconnect 160. The at least one solder interconnect 260 and the at least one pillar interconnect 160 may be located between the substrate 102 and the portion 180 of the integrated device 106. The integrated device 106 may be configured to be electrically coupled to the integrated device 104 through the at least one solder interconnect 260, the at least one pillar interconnect 160, the plurality of interconnects 122, and/or the plurality of solder interconnects 140. For example, an electrical path for at least one signal between the integrated device 104 and the integrated device 106 may include the at least one solder interconnect 260, the at least one pillar interconnect 160, at least one interconnect from the plurality of interconnects 122, and/or at least one solder interconnect from the plurality of solder interconnects 140.

Figure 3:
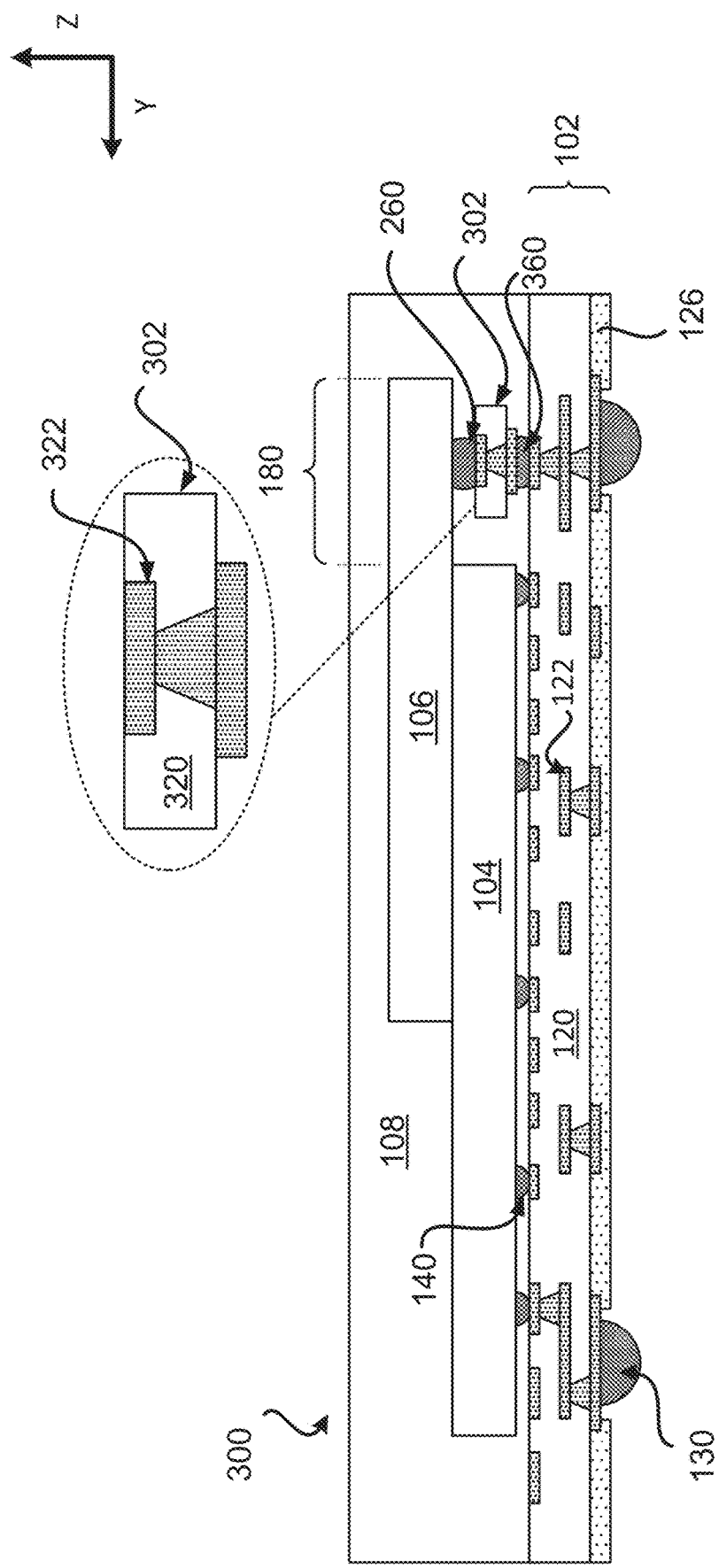
FIG. 3 illustrates a cross sectional profile view of a package that includes stacked integrated devices with overhang.

FIG. 3 illustrates a package 300 that includes stacked integrated devices with overhang. The package 300 is similar to the package 100, and includes similar components, the same components, and/or similar arrangements as the package 100. Thus, the description of the package 100 may be applicable to the package 300. FIG. 3 illustrates that the package 300 includes an interposer 302, at least one solder interconnect 260, and at least one solder interconnect 360. The at least one solder interconnect 260 is coupled to the integrated device 106 and the interposer 302. The at least one solder interconnect 260 may be coupled to the front side of the portion 180 of the integrated device 106. The at least one solder interconnect 360 may be coupled to the substrate 102 and the interposer 302. The integrated device 106 may be coupled to the substrate 102 through the at least one solder interconnect 260, the interposer 302 and the at least one solder interconnect 360. The interposer 302 may be a substrate. The interposer 302 includes at least one dielectric layer 320 and at least one interconnect 322 (e.g., interposer interconnect). The at least one solder interconnect 260, the interposer 302 and/or the at least one solder interconnect 360 may be located between the substrate 102 and the portion 180 of the integrated device 106.

The integrated device 106 may be configured to be electrically coupled to the integrated device 104 through the at least one solder interconnect 260, the interposer 302, the at least one solder interconnect 360, the plurality of interconnects 122, and/or the plurality of solder interconnects 140. For example, an electrical path for at least one signal between the integrated device 104 and the integrated device 106 may include the at least one solder interconnect 260, at least one interconnect 322, the at least one solder interconnect 360, at least one interconnect from the plurality of interconnects 122, and/or at least one solder interconnect from the plurality of solder interconnects 140.

FIGS. 1-3 illustrate that the at least one pillar interconnect 160, the at least one solder interconnect 260, the interposer 302, and/or the at least one solder interconnect 360 may be located between the substrate 102 and the portion 180 of the integrated device 106 that overhangs the integrated device 104.

Different implementations may include different numbers of integrated devices. For example, a package may include more than one integrated device that overhangs over one or more integrated devices.

Figure 4:
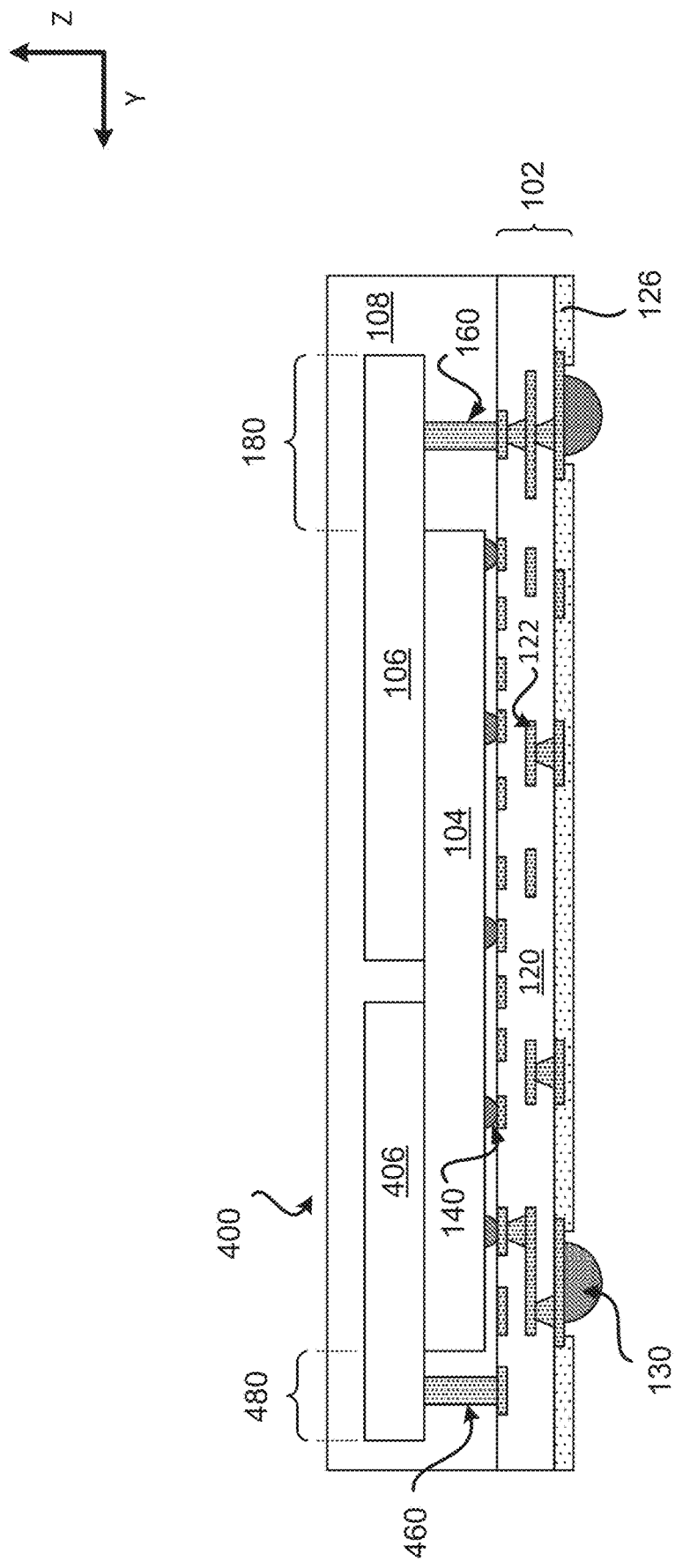
FIG. 4 illustrates a cross sectional profile view of a package that includes stacked integrated devices with overhang.

FIG. 4 illustrates a package 400 that includes stacked integrated devices with overhang. The package 400 is similar to the package 100, and includes similar components, the same components, and/or similar arrangements as the package 100. Thus, the description of the package 100 may be applicable to the package 400. FIG. 4 illustrates two integrated devices that overhang over an integrated device. FIG. 4 illustrates that the package 400 includes the substrate 102, the integrated device 104 (e.g., first integrated device), the integrated device 106 (e.g., second integrated device), an integrated device 406 (e.g., third integrated device), the encapsulation layer 108, at least one pillar interconnect 160 (e.g., at least one first pillar interconnect), and at least one pillar interconnect 460 (e.g., at least one second pillar interconnect).

The integrated device 406 is located over the integrated device 104. The integrated device 406 may be coupled to the integrated device 104 through an adhesive (not shown). A portion 480 of the integrated device 406 may overhang over the integrated device 104. The front side of the integrated device 406 may face the back side of the integrated device 104 and/or the substrate 102. For example, the front side of the portion 480 of the integrated device 406 may face the substrate 102. The front side of the integrated device 406 may be coupled to the back side of the integrated device 104 (e.g., mechanically coupled through an adhesive).

At least one pillar interconnect 460 may be coupled to the substrate 102 and to the front side of the portion 480 of the integrated device 406. The at least one pillar interconnect 460 may be coupled to the plurality of interconnect 122 through at least one solder interconnect (not shown). The integrated device 406 may be coupled to the substrate 102 through at least one pillar interconnect 460. The integrated device 406 may be configured to be electrically coupled to the integrated device 104 through the at least one pillar interconnect 460, the plurality of interconnects 122, and/or the plurality of solder interconnects 140. For example, an electrical path for at least one signal between the integrated device 104 and the integrated device 406 may include the at least one pillar interconnect 460, at least one interconnect from the plurality of interconnects 122, and/or at least one solder interconnect from the plurality of solder interconnects 140. In the instance there is solder interconnect between the at least one pillar interconnect 460 and the plurality of interconnects 122, the electrical path may also include the solder interconnect between the at least one pillar interconnect 460 and the plurality of interconnects 122.

The portion 480 of the integrated device 406 that overhangs over the integrated device 104 may have a different size and/or length than the portion 180 of the integrated device 106 that overhangs over the integrated device 104. Different implementations may have similar or different overhangs for different integrated devices. It is noted that the at least one pillar interconnect 160 may be from a plurality of pillar interconnects (e.g., rows of pillar interconnects) that are coupled between the integrated device 106 and the substrate 102. Similarly, the at least one pillar interconnect 460 may be from a plurality of pillar interconnects (e.g., rows of pillar interconnects) that are coupled between the integrated device 406 and the substrate 102.

Figure 5:
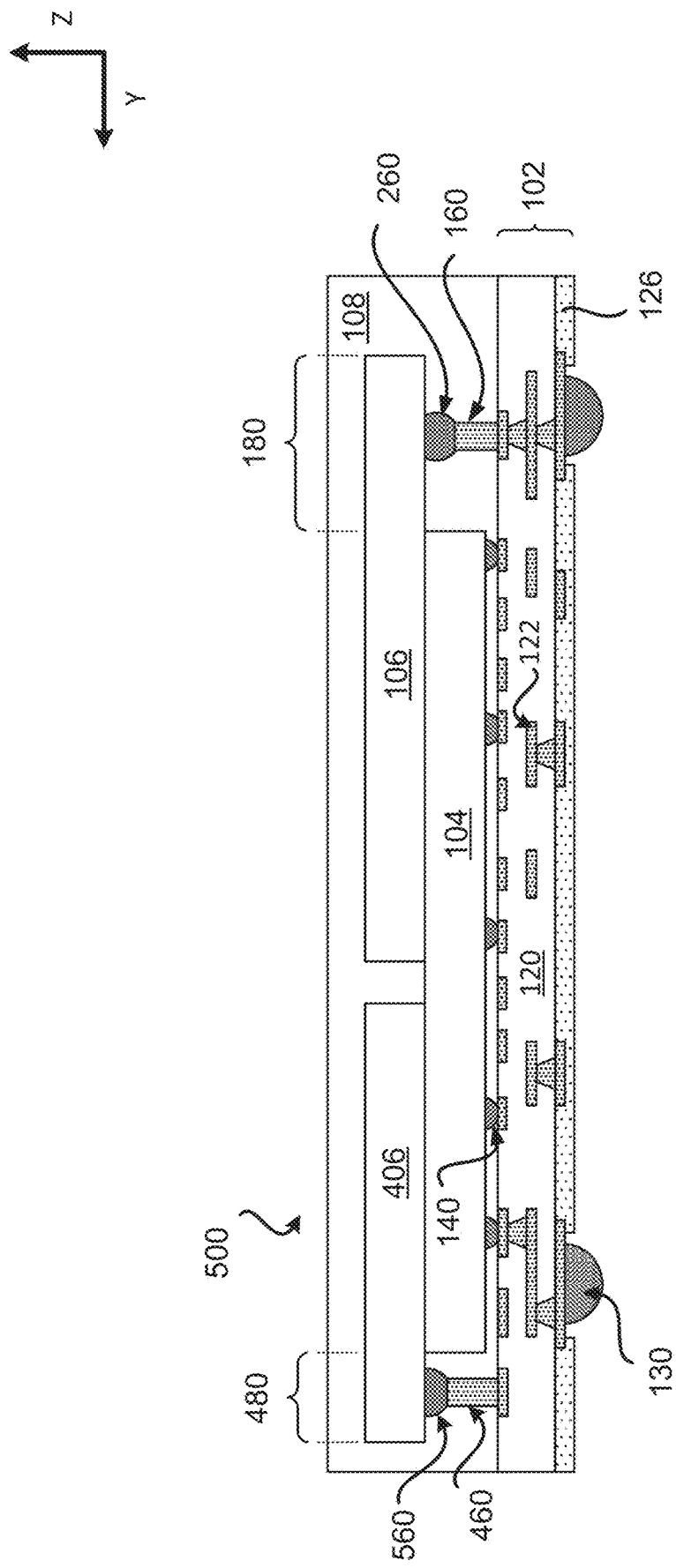
FIG. 5 illustrates a cross sectional profile view of a package that includes stacked integrated devices with overhang.

FIG. 5 illustrates a package 500 that includes stacked integrated devices with overhang. The package 500 is similar to the packages 200 and/or 400, and includes similar components, the same components, and/or similar arrangements as the packages 200 and/or 400. Thus, the description of the packages 200 and 400 may be applicable to the package 500. FIG. 5 illustrates two integrated devices that overhang over another integrated device. FIG. 5 illustrates that the package 500 includes the substrate 102, the integrated device 104, the integrated device 106, the integrated device 406, the encapsulation layer 108, at least one pillar interconnect 160 (e.g., at least one first pillar interconnect), at least one pillar interconnect 460 (e.g., at least one second pillar interconnect), at least one solder interconnect 260 (e.g., at least one first solder interconnect) and at least one solder interconnect 560 (e.g., at least one second solder interconnect).

A portion 480 of the integrated device 406 may overhang over the integrated device 104. The at least one solder interconnect 560 is coupled to the integrated device 406 and the at least one pillar interconnect 460. The at least one solder interconnect 560 may be coupled to the front side of the portion 480 of the integrated device 406. The at least one pillar interconnect 460 may be coupled to the substrate 102. In some implementations, the at least one pillar interconnect 460 may considered part of the substrate 102. The integrated device 406 may be coupled to the substrate 102 through the at least one solder interconnect 560 and the at least one pillar interconnect 460. The integrated device 406 may be configured to be electrically coupled to the integrated device 104 through the at least one solder interconnect 560, the at least one pillar interconnect 460, the plurality of interconnects 122, and/or the plurality of solder interconnects 140. For example, an electrical path for at least one signal between the integrated device 104 and the integrated device 406 may include the at least one solder interconnect 560, the at least one pillar interconnect 460, at least one interconnect from the plurality of interconnects 122, and/or at least one solder interconnect from the plurality of solder interconnects 140.

It is noted that the at least one pillar interconnect 160 and the at least one solder interconnect 260 may be from a plurality of pillar interconnects (e.g., rows of pillar interconnects) and from a plurality of solder interconnects (e.g., rows of solder interconnects) that are coupled between the integrated device 106 and the substrate 102. Similarly, the at least one pillar interconnect 460 and the at least one solder interconnect 560 may be from a plurality of pillar interconnects (e.g., rows of pillar interconnects) and from a plurality of solder interconnects (e.g., rows of solder interconnects) that are coupled between the integrated device 406 and the substrate 102.

Figure 6:
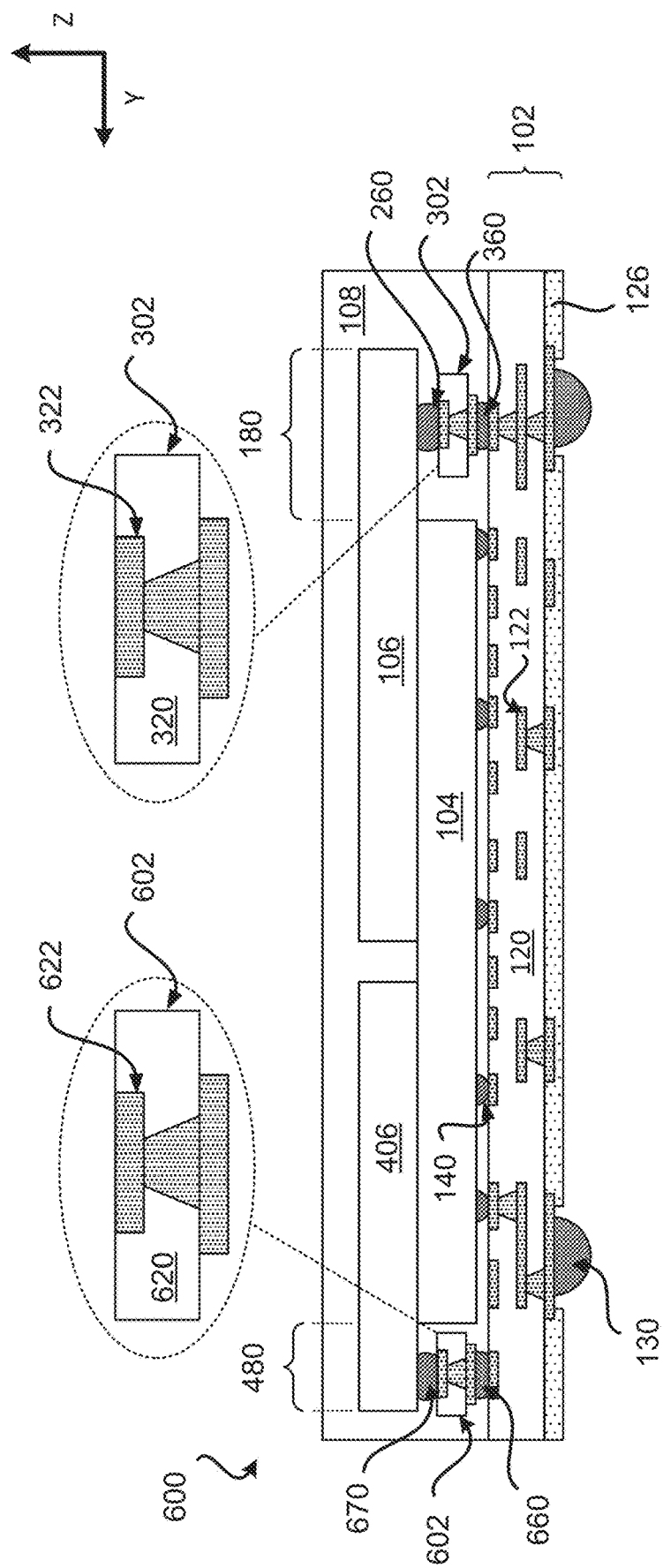
FIG. 6 illustrates a cross sectional profile view of a package that includes stacked integrated devices with overhang.

FIG. 6 illustrates a package 600 that includes stacked integrated devices with overhang. The package 600 is similar to the packages 300 and/or 400, and includes similar components, the same components, and/or similar arrangements as the packages 300 and/or 400. Thus, the description of the packages 300 and 400 may be applicable to the package 600. FIG. 6 illustrates two integrated devices that overhang over another integrated device. FIG. 6 illustrates that the package 600 includes the substrate 102, the integrated device 104, the integrated device 106, the integrated device 406, the encapsulation layer 108, an interposer 302 (e.g., first interposer), an interposer 602 (e.g., second interposer), at least one solder interconnect 260, at least one solder interconnect 360, at least one solder interconnect 660 and at least one solder interconnect 670.

A portion 480 of the integrated device 406 may overhang over the integrated device 104. The at least one solder interconnect 670 is coupled to the integrated device 406 and the interposer 602. The at least one solder interconnect 670 may be coupled to the front side of the portion 480 of the integrated device 406. The at least one solder interconnect 660 may be coupled to the substrate 102 and the interposer 602. The integrated device 406 may be coupled to the substrate 102 through the at least one solder interconnect 670, the interposer 602 and the at least one solder interconnect 660. The interposer 602 may be a substrate. The interposer 602 includes at least one dielectric layer 620 and at least one interconnect 622 (e.g., interposer interconnect). The interposer 602 may be similar to the interposer 302.

The integrated device 406 may be configured to be electrically coupled to the integrated device 104 through the at least one solder interconnect 670, the interposer 602, the at least one solder interconnect 660, the plurality of interconnects 122, and/or the plurality of solder interconnects 140. For example, an electrical path for at least one signal between the integrated device 104 and the integrated device 406 may include the at least one solder interconnect 670, at least one interconnect 622, the at least one solder interconnect 660, at least one interconnect from the plurality of interconnects 122, and/or at least one solder interconnect from the plurality of solder interconnects 140.

It is noted that the at least one interposer 302, the at least one solder interconnect 260, and the at least one solder interconnect 360 may be from a plurality of interposers (e.g., rows of interposer) and from a plurality of solder interconnects (e.g., rows of solder interconnects) that are coupled between the integrated device 106 and the substrate 102. Similarly, the at least one interposer 602, the at least one solder interconnect 670, and the at least one solder interconnect 660 may be from a plurality of interposers (e.g., rows of interposer) and from a plurality of solder interconnects (e.g., rows of solder interconnects) that are coupled between the integrated device 406 and the substrate 102.

It is noted that orientation of the interposer 302 and/or the interposer 602 shown in the disclosure is exemplary. The interposer 302 and/or the interposer 602 may be oriented in different ways. The interposer 302 and/or the interposer 602 may include a substrate. The interposer 302 and/or the interposer 602 may be fabricated using the process described in FIGS. 11A-11B. FIGS. 4-6 illustrate that the at least one pillar interconnect 160, the at least one solder interconnect 260, the interposer 302, and/or the at least one solder interconnect 360 may be located between the substrate 102 and the portion 180 of the integrated device 106 that overhangs the integrated device 104. FIGS. 4-6 also illustrate that the at least one pillar interconnect 460, the at least one solder interconnect 560, the interposer 602, and/or the at least one solder interconnect 660 may be located between the substrate 102 and the portion 480 of the integrated device 406 that overhangs the integrated device 104. It is noted that a package may include integrated devices that are coupled to the substrate using different combinations of pillar interconnects, solder interconnects and/or interposers. For example, one integrated device may be coupled to the substrate through a pillar interconnect, while another integrated device may be coupled to the substrate through an interposer. FIGS. 1-6 illustrate examples of integrated devices stacked on top of another, where one or more integrated devices (e.g., 106, 406) are coupled (e.g., mechanically coupled, electrically coupled) to a substrate (e.g., 102) through at least one non-wire bond. Examples of non-wire bonds include a pillar interconnect, a solder interconnect and/or an interposer. The non-wire bonds provide at least one electrical path between the integrated device and the substrate. The non-wire bonds may also provide structural support for the portion of the integrated device that overhangs over another integrated device.

An integrated device (e.g., 104, 106, 406) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filters, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 104, 106, 406) may include at least one electronic circuit (e.g., first electronic circuit, second electronic circuit, etc. . . . ).

In some implementations, the integrated device 104 (e.g., first integrated device) may include a processor and/or a modem. In some implementations, the integrated device 106 (e.g., second integrated device) and/or the integrated device 406 (e.g., third integrated device) may include memory. The integrated device 106 and the integrated device 406 may be planar to each other. The integrated device 106 and the integrated device 406 may have similar or different thicknesses.

Having described various packages, several methods for fabricating a package will now be described below.

Figure 7A:
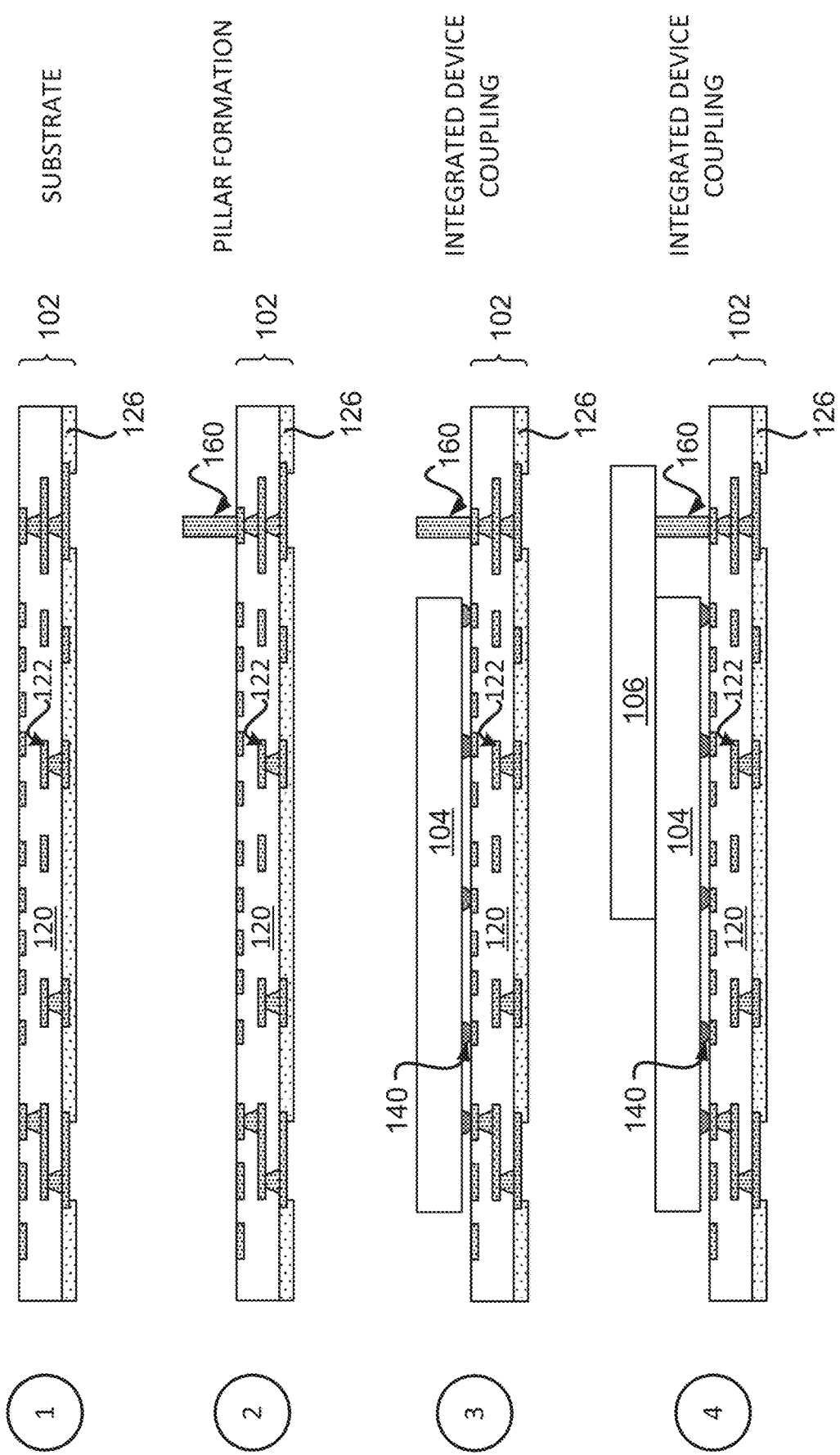
FIGS. 7A-7B illustrate an exemplary sequence for fabricating a package with stacked integrated devices with overhang.
Figure 7B:
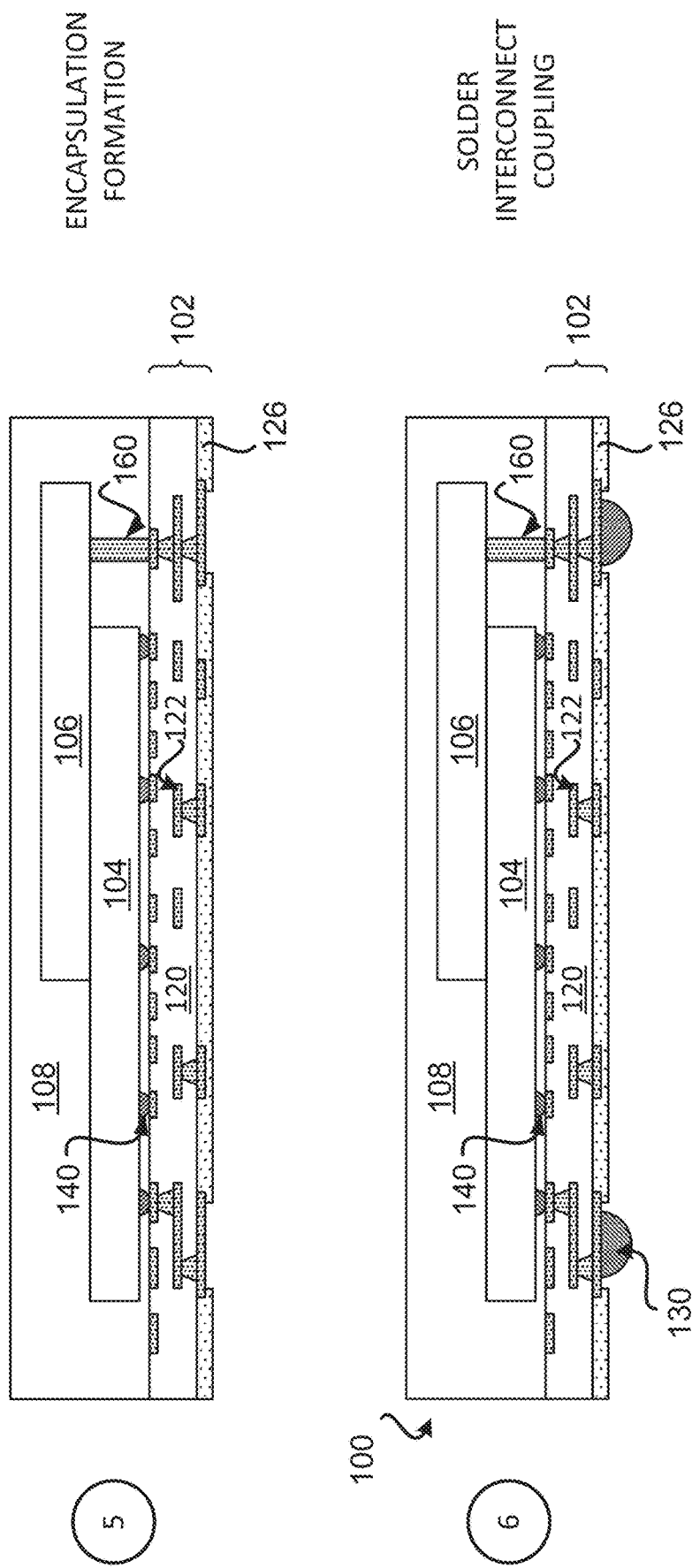

Exemplary Sequence for Fabricating a Package Comprising Stacked Integrated Devices with Overhang In some implementations, fabricating a package includes several processes. FIGS. 7A-7B illustrate an exemplary sequence for providing or fabricating a package. In some implementations, the sequence of FIGS. 7A-7B may be used to provide or fabricate the package 100 of FIG. 1. However, the process of FIGS. 7A-7B may be used to fabricate any of the packages (e.g., 400) described in the disclosure.

It should be noted that the sequence of FIGS. 7A-7B may combine one or more stages in order to simplify and/or clarify the sequence for providing or fabricating a package. In some implementations, the order of the processes may be changed or modified. In some implementations, one or more of processes may be replaced or substituted without departing from the scope of the disclosure.

Figure 11A:
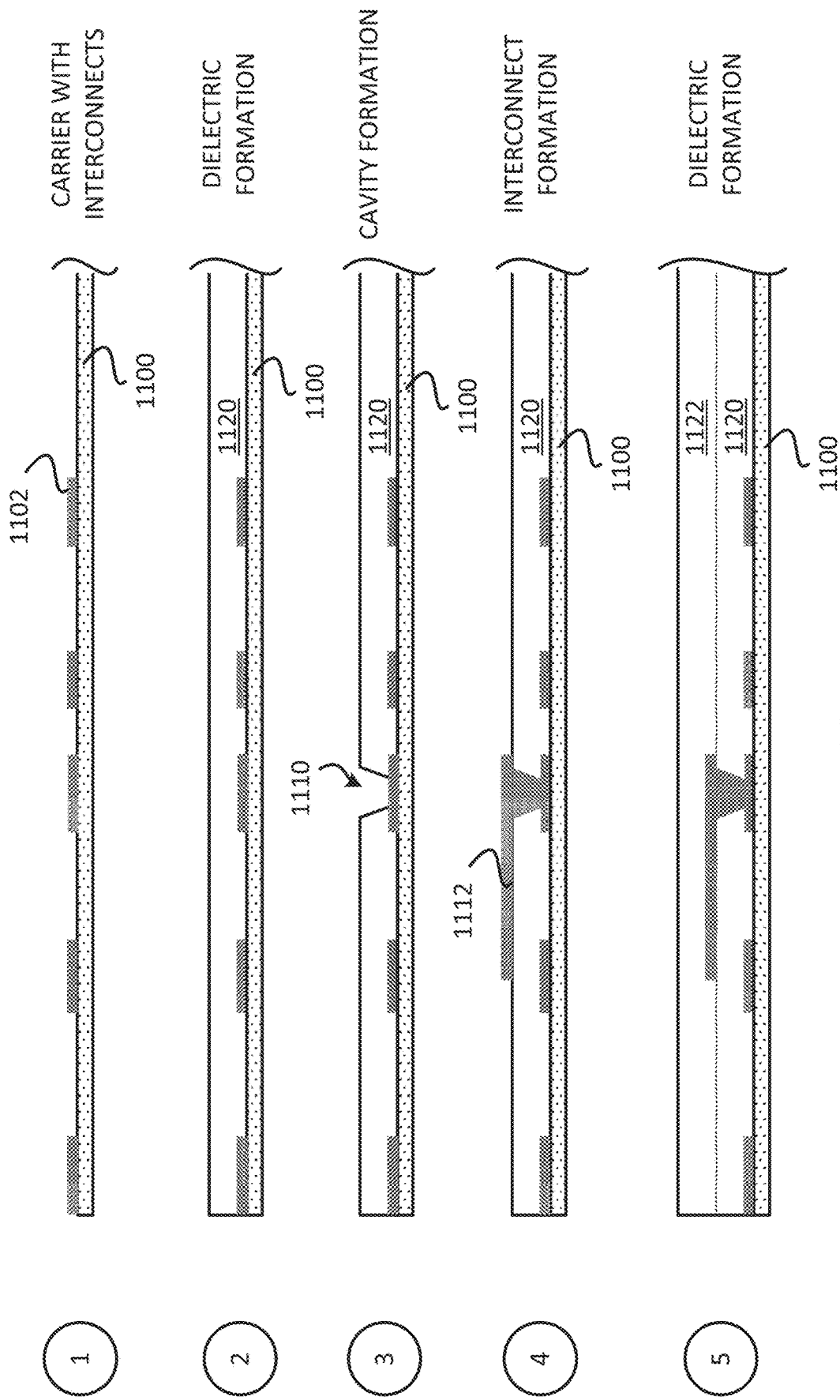
FIGS. 11A-11B illustrate an exemplary sequence for fabricating a substrate.
Figure 11B:
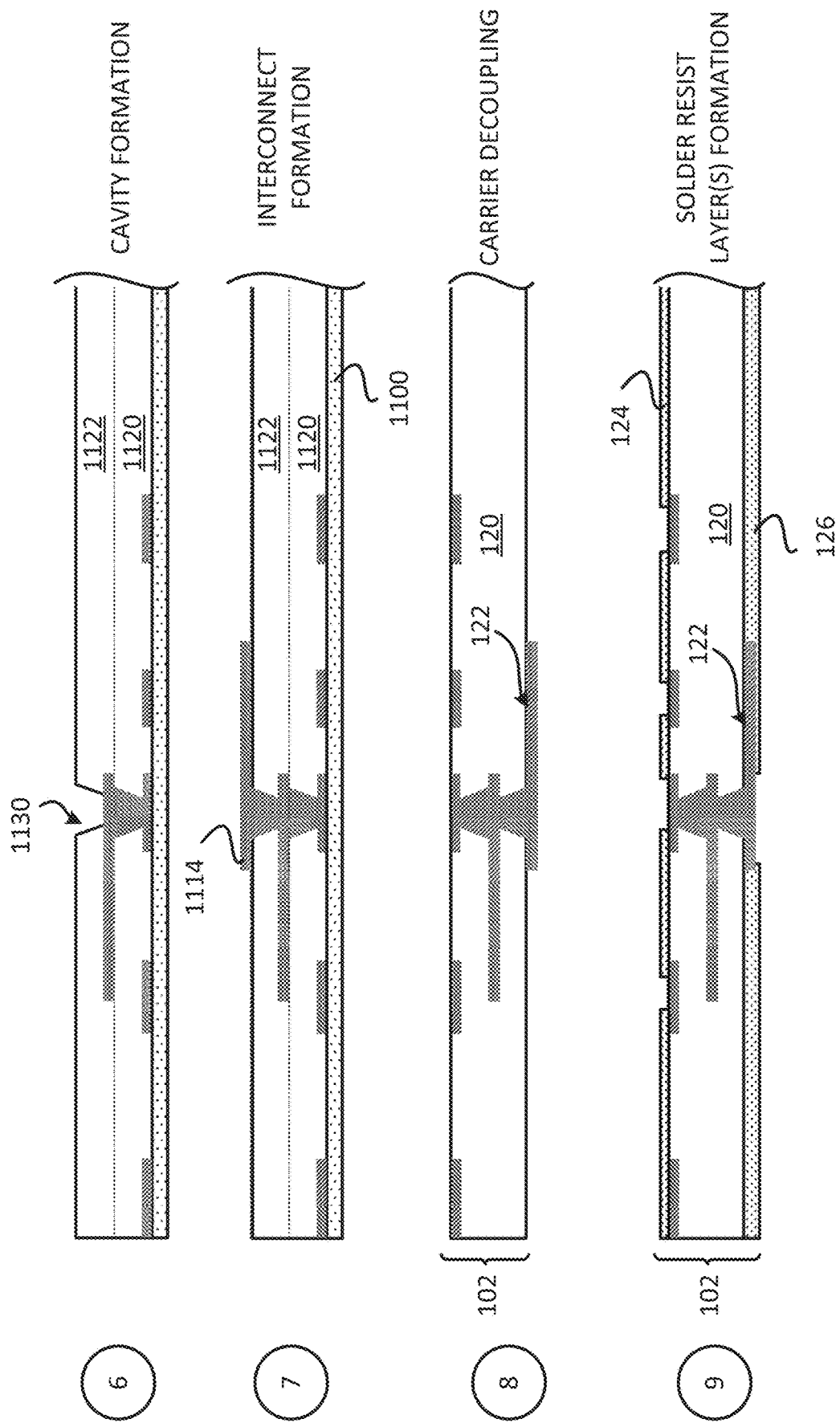

Stage 1, as shown in FIG. 7A, illustrates a state after a substrate 102 is provided. The substrate 102 includes at least one dielectric layer 120, a plurality of interconnects 122 and a solder resist layer 126. Different implementations may use different substrates with different numbers of metal layers. A substrate may include a coreless substrate, a cored substrate, or an embedded trace substrate (ETS). FIGS. 11A-11B illustrate and describe an example of fabricating a substrate.

Stage 2 illustrates a state after at least one pillar interconnect 160 is formed over the substrate 102. A plating process may be used to form the at least one pillar interconnect 160. The at least one pillar interconnect 160 may be coupled to at least one interconnect from the plurality of interconnects 122. It is noted that in some implementations, the at least one pillar interconnect 160 may be provided with the substrate 102, when the substrate 102 is provided at Stage 1. In some implementations, the at least one pillar interconnect 160 may be considered part of the substrate 102.

Stage 3 illustrates a state after an integrated device 104 (e.g., first integrated device) is coupled to the substrate 102. The integrated device 104 may be coupled to the substrate 102 through a plurality of solder interconnects 140. A solder reflow process may be used to couple the integrated device 104 to the substrate 102.

Stage 4 illustrates a state after the integrated device 106 (e.g., second integrated device) is coupled to the integrated device 104, such that a portion (e.g., 180) of the integrated device 106 overhangs over the integrated device 104. An adhesive may be used to couple the integrated device 106 to the integrated device 104. For example, the front side of the integrated device 106 may be coupled to the back side of the integrated device 104 through an adhesive. The integrated device 106 may be coupled to the substrate 102 through the at least one pillar interconnect 160. A solder reflow process may be used to couple the integrated device 106 to the at least one pillar interconnect 160, which may include using solder interconnects.

In some implementations, the integrated device 106 may include the at least one pillar interconnect 160. That is, in some implementations, the at least one pillar interconnect 160 may be formed and/or coupled to the integrated device 106 prior to being coupled to the substrate 102. In such instances, it may not be necessary to form the at least one pillar interconnect 160 (at Stage 2). A solder reflow process may be used to couple the at least one pillar interconnect 160 (e.g., of the integrated device 106) to the substrate 102. In such an instance, at least one solder interconnect may be coupled to the at least one pillar interconnect 160 and at least one interconnect from the plurality of interconnects 122. Different implementations may couple different integrated devices to the integrated device 104 and/or the substrate 102. For example, an integrated device 406 may be coupled to the integrated device 104.

Stage 5, as shown in FIG. 7B, illustrates a state after an encapsulation layer 108 is provided (e.g., formed) over the substrate 102 and the integrated devices (e.g., 104, 106). The encapsulation layer 108 may encapsulate the integrated devices(s) and/or the components. The encapsulation layer 108 may include a mold, a resin and/or an epoxy. A compression molding process, a transfer molding process, or a liquid molding process may be used to form the encapsulation layer 108. The encapsulation layer 108 may be photo etchable. The encapsulation layer 108 may be a means for encapsulation.

Stage 6 illustrates a state after a plurality of solder interconnects 130 is coupled to the substrate 102. A solder reflow process may be used to couple the plurality of solder interconnects 130 to interconnects from the plurality of interconnects 122 of the substrate 102. Stage 6 may illustrate an example of a package 100 that includes stacked integrated devices with overhang.

Figure 8A:
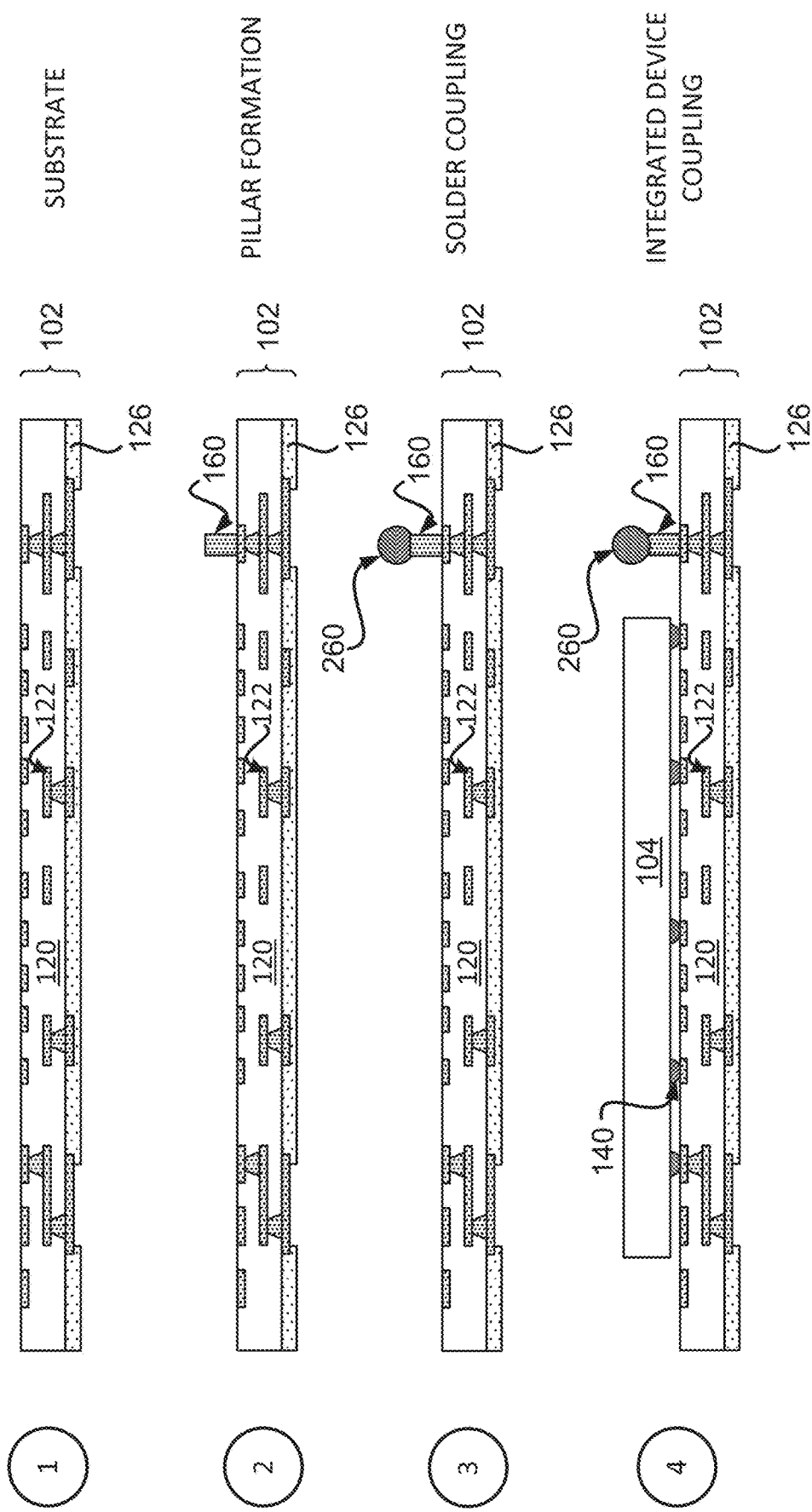

Exemplary Sequence for Fabricating a Package Comprising Stacked Integrated Devices with Overhang In some implementations, fabricating a package includes several processes. FIGS. 8A-8B illustrate an exemplary sequence for providing or fabricating a package. In some implementations, the sequence of FIGS. 8A-8B may be used to provide or fabricate the package 200 of FIG. 2. However, the process of FIGS. 8A-8B may be used to fabricate any of the packages (e.g., 500) described in the disclosure.

It should be noted that the sequence of FIGS. 8A-8B may combine one or more stages in order to simplify and/or clarify the sequence for providing or fabricating a package. In some implementations, the order of the processes may be changed or modified. In some implementations, one or more of processes may be replaced or substituted without departing from the scope of the disclosure.

Stage 1, as shown in FIG. 8A, illustrates a state after a substrate 102 is provided. The substrate 102 includes at least one dielectric layer 120, a plurality of interconnects 122 and a solder resist layer 126. Different implementations may use different substrates with different numbers of metal layers. A substrate may include a coreless substrate, a cored substrate, or an embedded trace substrate (ETS). FIGS. 11A-11B illustrate and describe an example of fabricating a substrate.

Stage 2 illustrates a state after at least one pillar interconnect 160 is formed over the substrate 102. A plating process may be used to form the at least one pillar interconnect 160. The at least one pillar interconnect 160 may be coupled to at least one interconnect from the plurality of interconnects 122. It is noted that in some implementations, the at least one pillar interconnect 160 may be provided with the substrate 102, when the substrate 102 is provided at Stage 1. In some implementations, the at least one pillar interconnect 160 may be considered part of the substrate 102.

Stage 3 illustrates a state after at least one solder interconnect 260 is formed over the at least one pillar interconnect 160. A solder reflow process may be used to couple the at least one solder interconnect 260 to the at least one pillar interconnect 160.

Stage 4 illustrates a state after an integrated device 104 (e.g., first integrated device) is coupled to the substrate 102. The integrated device 104 may be coupled to the substrate 102 through a plurality of solder interconnects 140. A solder reflow process may be used to couple the integrated device 104 to the substrate 102.

Stage 5, as shown in FIG. 8B, illustrates a state after the integrated device 106 (e.g., second integrated device) is coupled to the integrated device 104, such that a portion (e.g., 180) of the integrated device 106 overhangs over the integrated device 104. An adhesive may be used to couple the integrated device 106 to the integrated device 104. For example, the front side of the integrated device 106 may be coupled to the back side of the integrated device 104 through an adhesive. The integrated device 106 may be coupled to the substrate 102 through the at least one solder interconnect 260 and the at least one pillar interconnect 160. A solder reflow process may be used to couple the integrated device 106 to the at least one pillar interconnect 160 through the at least one solder interconnect 260. Different implementations may couple different integrated devices to the integrated device 104 and/or the substrate 102. For example, an integrated device 406 may be coupled to the integrated device 104.

Stage 6 illustrates a state after an encapsulation layer 108 is provided (e.g., formed) over the substrate 102 and the integrated devices. The encapsulation layer 108 may encapsulate the integrated devices(s) and/or the components. The encapsulation layer 108 may include a mold, a resin and/or an epoxy. A compression molding process, a transfer molding process, or a liquid molding process may be used to form the encapsulation layer 108. The encapsulation layer 108 may be photo etchable. The encapsulation layer 108 may be a means for encapsulation.

Stage 7 illustrates a state after a plurality of solder interconnects 130 is coupled to the substrate 102. A solder reflow process may be used to couple the plurality of solder interconnects 130 to interconnects from the plurality of interconnects 122 of the substrate 102. Stage 7 may illustrate an example of a package 200 that includes stacked integrated devices with overhang.

Figure 9A:
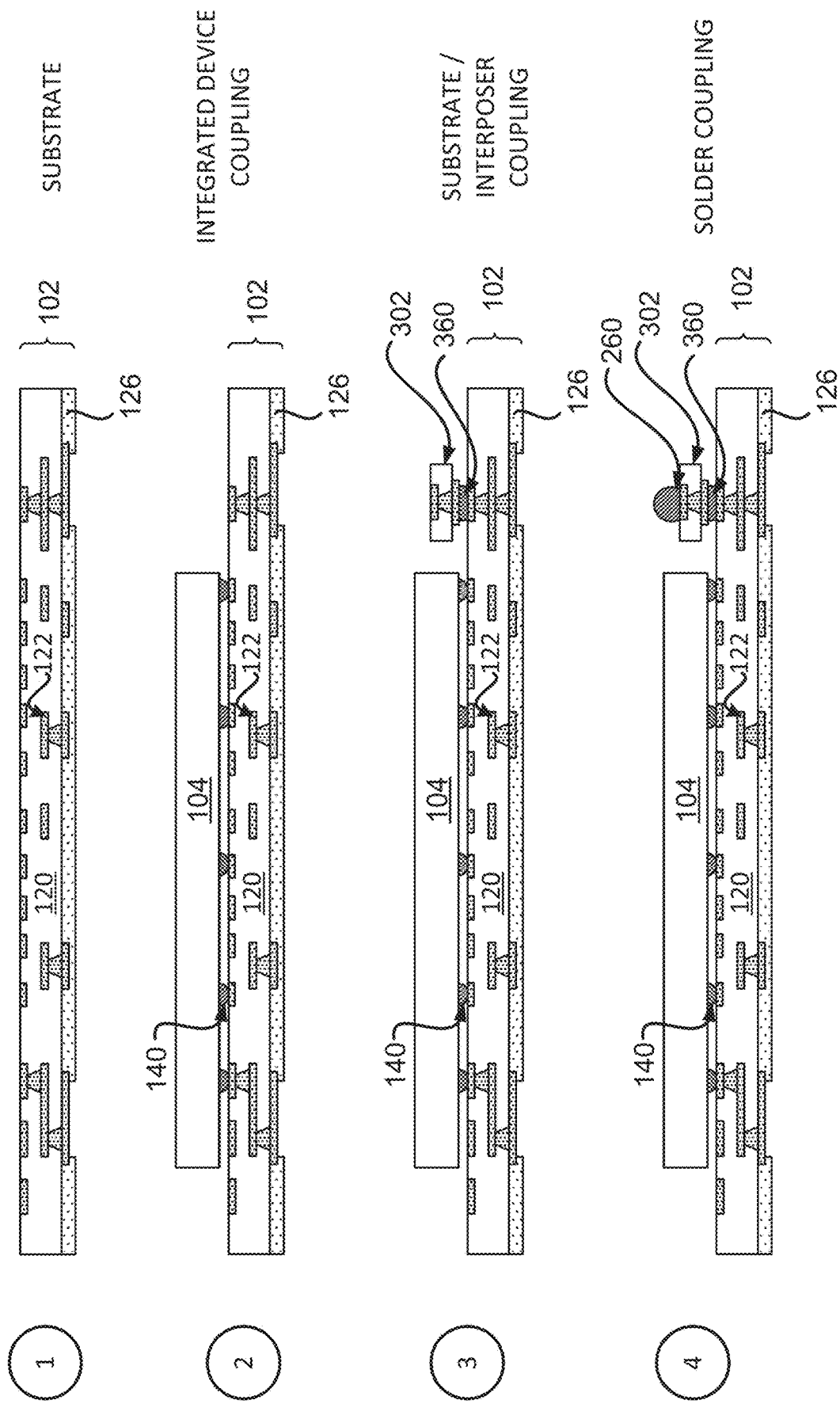
FIGS. 9A-9B illustrate an exemplary sequence for fabricating a package with stacked integrated devices with overhang.
Figure 9B:
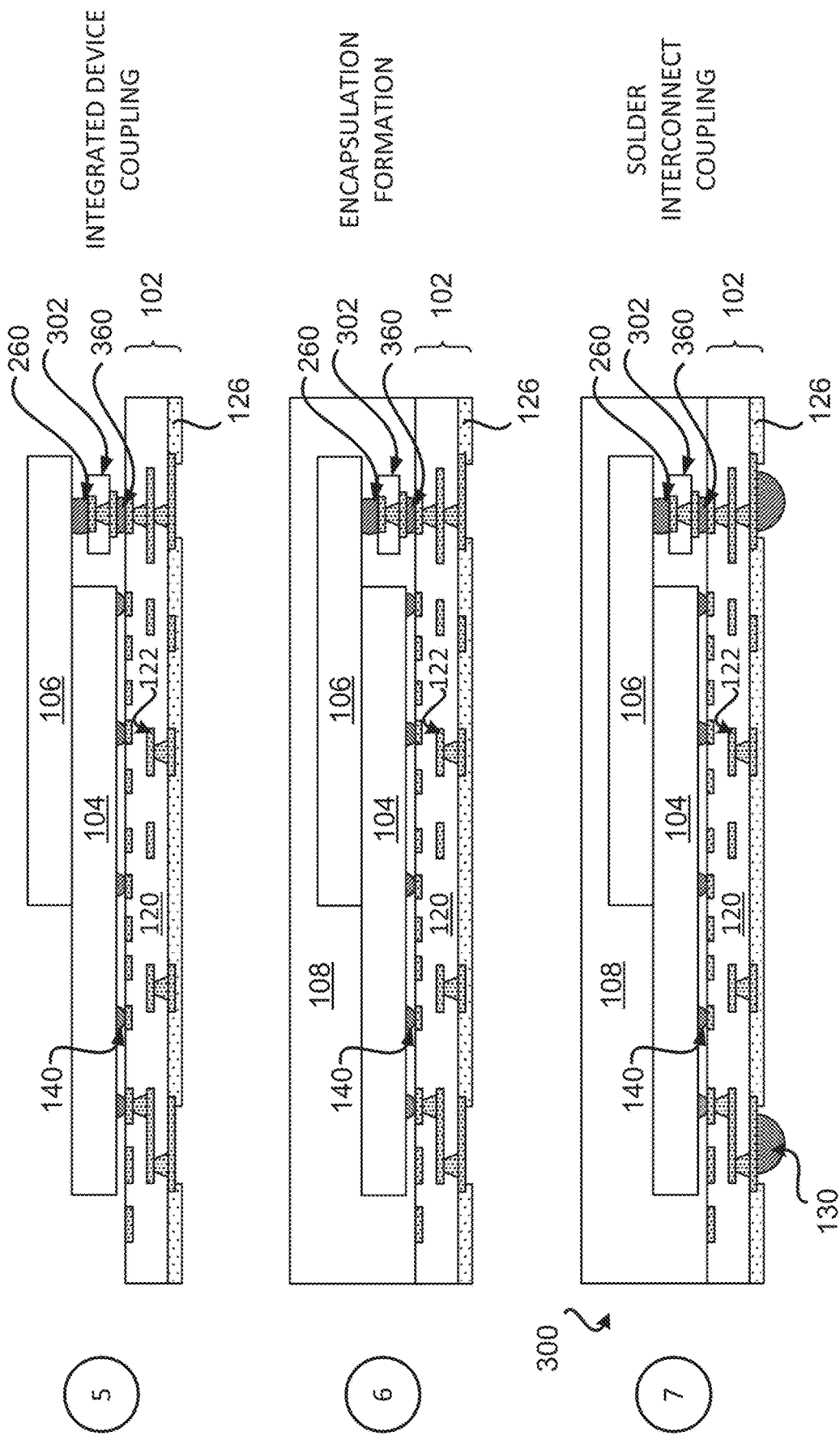

Exemplary Sequence for Fabricating a Package Comprising Stacked Integrated Devices with Overhang In some implementations, fabricating a package includes several processes. FIGS. 9A-9B illustrate an exemplary sequence for providing or fabricating a package. In some implementations, the sequence of FIGS. 9A-9B may be used to provide or fabricate the package 300 of FIG. 3. However, the process of FIGS. 9A-9B may be used to fabricate any of the packages (e.g., 600) described in the disclosure.

It should be noted that the sequence of FIGS. 9A-9B may combine one or more stages in order to simplify and/or clarify the sequence for providing or fabricating a package. In some implementations, the order of the processes may be changed or modified. In some implementations, one or more of processes may be replaced or substituted without departing from the scope of the disclosure.

Stage 1, as shown in FIG. 9A, illustrates a state after a substrate 102 is provided. The substrate 102 includes at least one dielectric layer 120, a plurality of interconnects 122 and a solder resist layer 126. Different implementations may use different substrates with different numbers of metal layers. A substrate may include a coreless substrate, a cored substrate, or an embedded trace substrate (ETS). FIGS. 11A-11B illustrate and describe an example of fabricating a substrate.

Stage 2 illustrates a state after an integrated device 104 (e.g., first integrated device) is coupled to the substrate 102. The integrated device 104 may be coupled to the substrate 102 through a plurality of solder interconnects 140. A solder reflow process may be used to couple the integrated device 104 to the substrate 102.

Stage 3 illustrates a state after an interposer 302 is coupled to the substrate 102. The interposer 302 may be coupled to the substrate 102 through at least one solder interconnect 360. The at least one solder interconnect 360 may be coupled to interconnects from the plurality of interconnects 122. A solder reflow process may be used to couple the interposer 302 to the substrate 102.

Stage 4 illustrates a state after at least one solder interconnect 260 is formed over the interposer 302. A solder reflow process may be used to couple the at least one solder interconnect 260 to the interposer 302.

Stage 5, as shown in FIG. 9B, illustrates a state after the integrated device 106 (e.g., second integrated device) is coupled to the integrated device 104, such that a portion (e.g., 180) of the integrated device 106 overhangs over the integrated device 104. An adhesive may be used to couple the integrated device 106 to the integrated device 104. For example, the front side of the integrated device 106 may be coupled to the back side of the integrated device 104 through an adhesive. The integrated device 106 may be coupled to the substrate 102 through the interposer 302. A solder reflow process may be used to couple the integrated device 106 to the interposer 302 through the at least one solder interconnect 260. Different implementations may couple different integrated devices to the integrated device 104 and/or the substrate 102. For example, an integrated device 406 may be coupled to the integrated device 104.

Stage 6 illustrates a state after an encapsulation layer 108 is provided (e.g., formed) over the substrate 102 and the integrated devices. The encapsulation layer 108 may encapsulate the integrated devices(s) and/or the components. The encapsulation layer 108 may include a mold, a resin and/or an epoxy. A compression molding process, a transfer molding process, or a liquid molding process may be used to form the encapsulation layer 108. The encapsulation layer 108 may be photo etchable. The encapsulation layer 108 may be a means for encapsulation.

Stage 7 illustrates a state after a plurality of solder interconnects 130 is coupled to the substrate 102. A solder reflow process may be used to couple the plurality of solder interconnects 130 to interconnects from the plurality of interconnects 122 of the substrate 102. Stage 7 may illustrate an example of a package 300 that includes stacked integrated devices with overhang.

Figure 10:
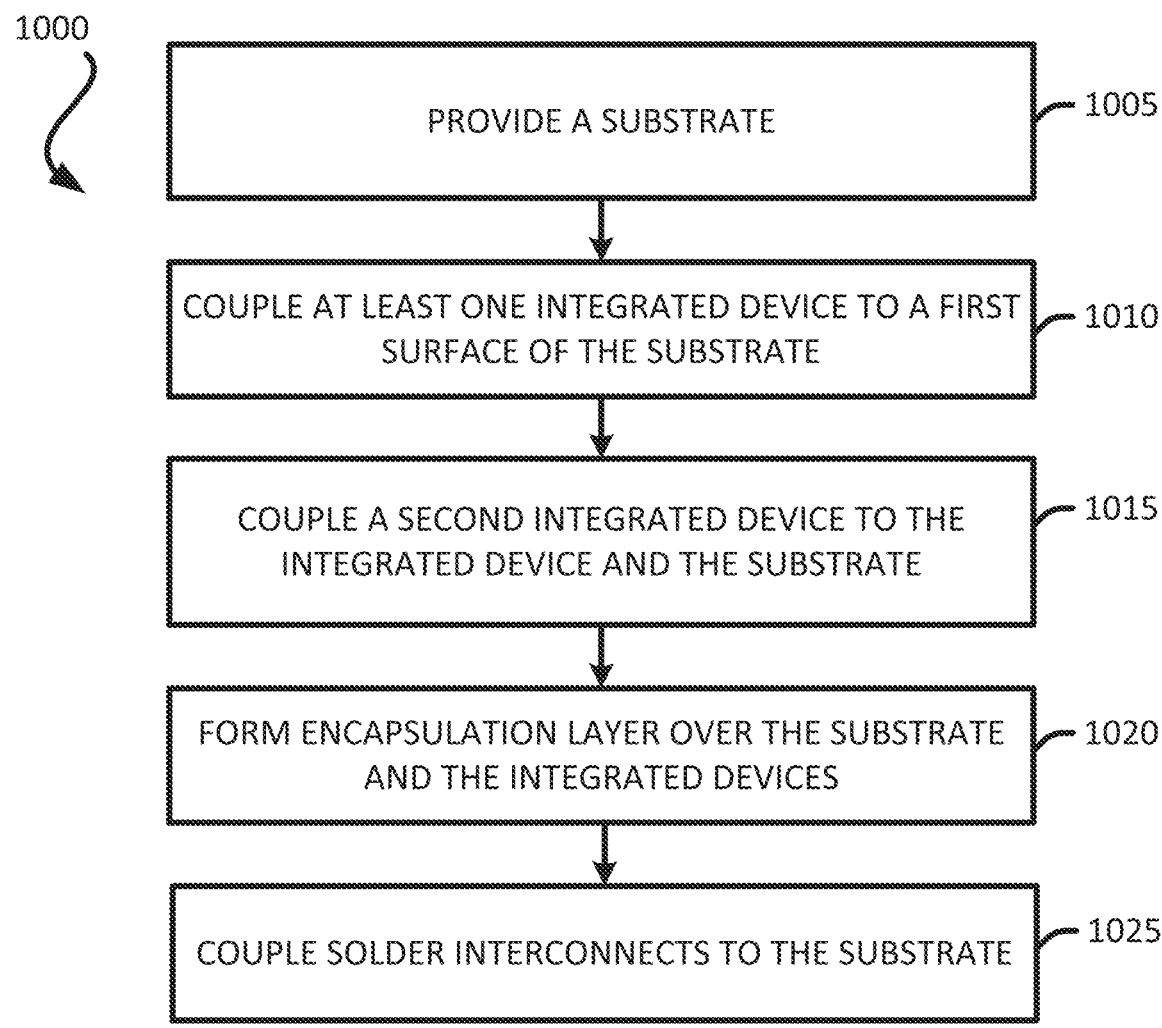
FIG. 10 illustrates an exemplary flow diagram of a method for fabricating a package with stacked integrated devices with overhang.

Exemplary Flow Diagram of a Method for Fabricating a Package that Includes Stacked Integrated Devices with Overhang In some implementations, fabricating a package that includes a substrate and stacked integrated devices with overhang includes several processes. FIG. 10 illustrates an exemplary flow diagram of a method 1000 for providing or fabricating a package. In some implementations, the method 1000 of FIG. 10 may be used to provide or fabricate the package 100 of FIG. 1 described in the disclosure. However, the method 1000 may be used to provide or fabricate any of the packages (e.g., 200, 300, 400, 500, 600) described in the disclosure.

It should be noted that the method of FIG. 10 may combine one or more processes in order to simplify and/or clarify the method for providing or fabricating a package. In some implementations, the order of the processes may be changed or modified.

The method provides (at 1005) a substrate (e.g., 102). The substrate 102 may be provided by a supplier or fabricated. A process similar to the process shown in FIGS. 11A-11B may be used to fabricate the substrate 102. However, different implementations may use different processes to fabricate the substrate 102. Examples of processes that may be used to fabricate the substrate 102 include a semi-additive process (SAP) and a modified semi-additive process (mSAP). The substrate 102 includes at least one dielectric layer 120, a plurality of interconnects 122, and a solder resist layer 126. The substrate 102 may include an embedded trace substrate (ETS). In some implementations, the at least one dielectric layer 120 may include prepreg layers. In some implementations, the substrate 102 may include at least one pillar interconnect (e.g., 160). Stage 1 of FIG. 7A illustrates and describes an example of providing a substrate.

The method couples (at 1010) at least one integrated device (e.g., first integrated device) to the substrate. For example, the integrated device 104 is coupled to a first surface (e.g., top surface) of the substrate 102. The integrated device 104 may be coupled to the substrate 102 through a plurality of solder interconnects 140. In some implementations, the integrated device 104 may be coupled to the substrate 102 through a plurality of pillar interconnects (not shown) and the plurality of solder interconnects 140. A solder reflow process may be used to couple the integrated device 104 to the substrate 102 through the plurality of solder interconnects 140. Stage 2 of FIG. 7A illustrates and describes an example of coupling at least one integrated device to a substrate.

The method couples (at 1015) another integrated device to an integrated device. For example, the integrated device 106 (e.g., second integrated device) is coupled to the integrated device 104, such that a portion (e.g., 180) of the integrated device 106 overhangs the integrated device 104. An adhesive may be used to couple the integrated device 106 to the integrated device 104. For example, the front side of the integrated device 106 may be coupled to the back side of the integrated device 104 through an adhesive. The integrated device 106 may include at least one pillar interconnect 160. The integrated device 106 may be coupled to the substrate 102 through the at least one pillar interconnect 160. A solder reflow process may be used to couple the at least one pillar interconnect 160 to the substrate 102. In such an instance, at least one solder interconnect may be coupled to the at least one pillar interconnect 160 and at least one interconnect from the plurality of interconnects 122. It is noted that the at least one pillar interconnect 160 may be part of the substrate 102 and/or be part of the integrated device 106, prior to coupling the integrated device 106 to the substrate 102. Stage 4 of FIG. 7A illustrates and describes an example of coupling an integrated devices through at least one pillar interconnect.

In some implementations, the integrated device 106 may be coupled to the substrate 102 through the at least one solder interconnect 260 and the at least one pillar interconnect 160. In some implementations, the at least one pillar interconnect 160 may be considered part of the integrated device 106. In some implementations, the at least one pillar interconnect 160 may be considered part of the substrate 102. A solder reflow process may be used to couple the integrated device 106 to the at least one pillar interconnect 160 through the at least one solder interconnect 260. Stage 5 of FIG. 8B illustrates and describes an example of coupling an integrated devices through at least one pillar interconnect and at least one solder interconnect.

In some implementations, the integrated device 106 may be coupled to the substrate 102 through an interposer 302. A solder reflow process may be used to couple the integrated device 106 to the interposer 302 through the at least one solder interconnect 260. The interposer 302 may be coupled to the substrate 102 through a solder reflow process. Stage 5 of FIG. 9B illustrates and describes an example of coupling an integrated devices through at least interposer.

The method forms (at 1020) an encapsulation layer (e.g., 108) over the substrate (e.g., 102). The encapsulation layer 108 may be provided and formed over the substrate 102 and the integrated devices (e.g., 104, 106). The encapsulation layer 108 may encapsulate the integrated devices(s) and/or the components. The encapsulation layer 108 may include a mold, a resin and/or an epoxy. A compression molding process, a transfer molding process, or a liquid molding process may be used to form the encapsulation layer 108. The encapsulation layer 108 may be photo etchable. The encapsulation layer 108 may be a means for encapsulation. Stage 5 of FIG. 7B illustrates and describes an example of forming an encapsulation layer.

The method couples (at 1025) a plurality of solder interconnects (e.g., 130) to the second surface of the substrate (e.g., 102). The plurality of solder interconnects 130 may be coupled to interconnects (e.g., 122) that are located over a second surface of the at least one dielectric layer 120. A solder reflow process may be used to couple the plurality of solder interconnects 130 to the substrate 102. Stage 6 of FIG. 7B illustrates and describes an example of coupling solder interconnects to a substrate.

The packages (e.g., 100) described in the disclosure may be fabricated one at a time or may be fabricated together as part of one or more wafers and then singulated into individual packages.

Exemplary Sequence for Fabricating a Substrate

In some implementations, fabricating a substrate includes several processes. FIGS. 11A-11B illustrate an exemplary sequence for providing or fabricating a substrate. In some implementations, the sequence of FIGS. 11A-11B may be used to provide or fabricate the substrate 102 of FIG. 1. However, the process of FIGS. 11A-11B may be used to fabricate any of the substrates described in the disclosure.

It should be noted that the sequence of FIGS. 11A-11B may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Stage 1, as shown in FIG. 11A, illustrates a state after a carrier 1100 is provided and a metal layer is formed over the carrier 1100. The metal layer may be patterned to form interconnects 1102. A plating process and etching process may be used to form the metal layer and interconnects. In some implementations, the carrier 1100 may be provided with a metal layer that is patterned to form the interconnects 1102.

Stage 2 illustrates a state after a dielectric layer 1120 is formed over the carrier 1100 and the interconnects 1102. A deposition and/or lamination process may be used to form the dielectric layer 1120. The dielectric layer 1120 may include polyimide. However, different implementations may use different materials for the dielectric layer.

Stage 3 illustrates a state after a plurality of cavities 1110 is formed in the dielectric layer 1120. The plurality of cavities 1110 may be formed using an etching process (e.g., photo etching process) or laser process.

Stage 4 illustrates a state after interconnects 1112 are formed in and over the dielectric layer 1120, including in and over the plurality of cavities 1110. For example, a via, pad and/or traces may be formed. A plating process may be used to form the interconnects.

Stage 5 illustrates a state after another dielectric layer 1122 is formed over the dielectric layer 1120. A deposition and/or lamination process may be used to form the dielectric layer 1122. The dielectric layer 1122 may be the same material as the dielectric layer 1120. However, different implementations may use different materials for the dielectric layer.

Stage 6, as shown in FIG. 11B, illustrates a state after a plurality of cavities 1130 is formed in the dielectric layer 1122. An etching process or laser process may be used to form the cavities 1130.

Stage 7 illustrates a state after interconnects 1114 are formed in and over the dielectric layer 1122, including in and over the plurality of cavities 1130. For example, via, pad and/or trace may be formed. A plating process may be used to form the interconnects.

It is noted that Stages 5 through 7 may be iteratively repeated to form additional metal layers and additional dielectric layers. Some or all of the interconnects 1102, 1112, and/or 1114 may define a plurality of interconnects 122 of the substrate 102. The dielectric layers 1120, and 1122 may be represented by the at least one dielectric layer 120.

Stage 8 illustrates a state after the carrier 1100 is decoupled (e.g., removed, grinded out) from the dielectric layer 120, leaving the substrate 102 that includes the at least one dielectric layer 120 and the plurality of interconnects 122.

Stage 9 illustrates a state after the solder resist layer 124 and the solder resist layer 126 are formed over the substrate 102. A deposition process may be used to form the solder resist layer 124 and the solder resist layer 126. In some implementations, none or one solder resist layer may be formed over the at least one dielectric layer 120.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Flow Diagram of a Method for Fabricating a Substrate

Figure 12:
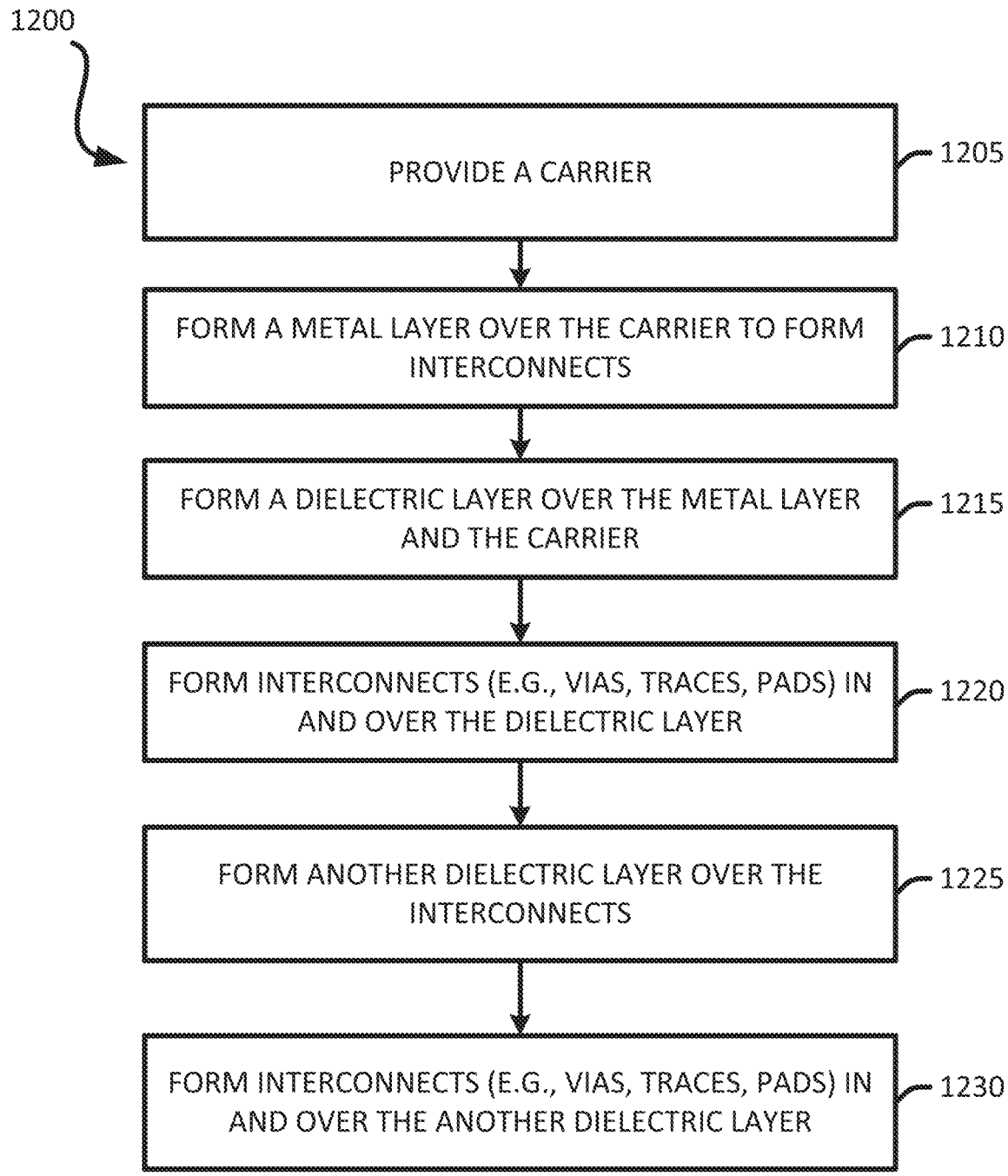
FIG. 12 illustrates an exemplary flow diagram of a method for fabricating a substrate.

In some implementations, fabricating a substrate includes several processes. FIG. 12 illustrates an exemplary flow diagram of a method 1200 for providing or fabricating a substrate. In some implementations, the method 1200 of FIG. 12 may be used to provide or fabricate the substrate(s) of FIG. 1. For example, the method of FIG. 12 may be used to fabricate the substrate 102.

It should be noted that the method 1200 of FIG. 12 may combine one or more processes in order to simplify and/or clarify the method for providing or fabricating a substrate. In some implementations, the order of the processes may be changed or modified.

The method provides (at 1205) a carrier 1100. Different implementations may use different materials for the carrier. The carrier may include a substrate, glass, quartz and/or carrier tape. Stage 1 of FIG. 11A illustrates and describes an example of a carrier that is provided.

The method forms (at 1210) a metal layer over the carrier 1100. The metal layer may be patterned to form interconnects. A plating process may be used to form the metal layer and interconnects. In some implementations, the carrier may include a metal layer. The metal layer over the carrier may be patterned to form interconnects (e.g., 1102). Stage 1 of FIG. 11A illustrates and describes an example of a metal layer and interconnects that are formed over a carrier.

The method forms (at 1215) a dielectric layer 1120 over the carrier 1100 and the interconnects 1102. A deposition and/or lamination process may be used to form the dielectric layer. The dielectric layer 1120 may include polyimide. Forming the dielectric layer may also include forming a plurality of cavities (e.g., 1110) in the dielectric layer 1120. The plurality of cavities may be formed using an etching process (e.g., photo etching) or laser process. Stages 2-3 of FIG. 11A illustrate and describe an example of forming a dielectric layer and cavities in the dielectric layer.

The method forms (at 1220) interconnects in and over the dielectric layer. For example, the interconnects 1112 may be formed in and over the dielectric layer 1120. A plating process may be used to form the interconnects. Forming interconnects may include providing a patterned metal layer over and/or in the dielectric layer. Forming interconnects may also include forming interconnects in cavities of the dielectric layer. Stage 4 of FIG. 11A illustrates and describes an example of forming interconnects in and over a dielectric layer.

The method forms (at 1225) a dielectric layer 1122 over the dielectric layer 1120 and the interconnects. A deposition and/or lamination process may be used to form the dielectric layer. The dielectric layer 1122 may include polyimide. Forming the dielectric layer may also include forming a plurality of cavities (e.g., 1130) in the dielectric layer 1122. The plurality of cavities may be formed using an etching process or laser process. Stages 5-6 of FIGS. 11A-11B illustrate and describe an example of forming a dielectric layer and cavities in the dielectric layer.

The method forms (at 1230) interconnects in and/or over the dielectric layer. For example, the interconnects 1114 may be formed. A plating process may be used to form the interconnects. Forming interconnects may include providing a patterned metal layer over an in the dielectric layer. Forming interconnects may also include forming interconnects in cavities of the dielectric layer. Stage 7 of FIG. 11B illustrates and describes an example of forming interconnects in and over a dielectric layer.

The method may form additional dielectric layer(s) and additional interconnects as described at 1225 and 1230.

Once all the dielectric layer(s) and additional interconnects are formed, the method may decouple (e.g., remove, grind out) the carrier (e.g., 1100) from the dielectric layer 1120, leaving the substrate. In some implementations, the method may form one or more solder resist layers (e.g., 124, 126) over the substrate.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Electronic Devices

Figure 13:
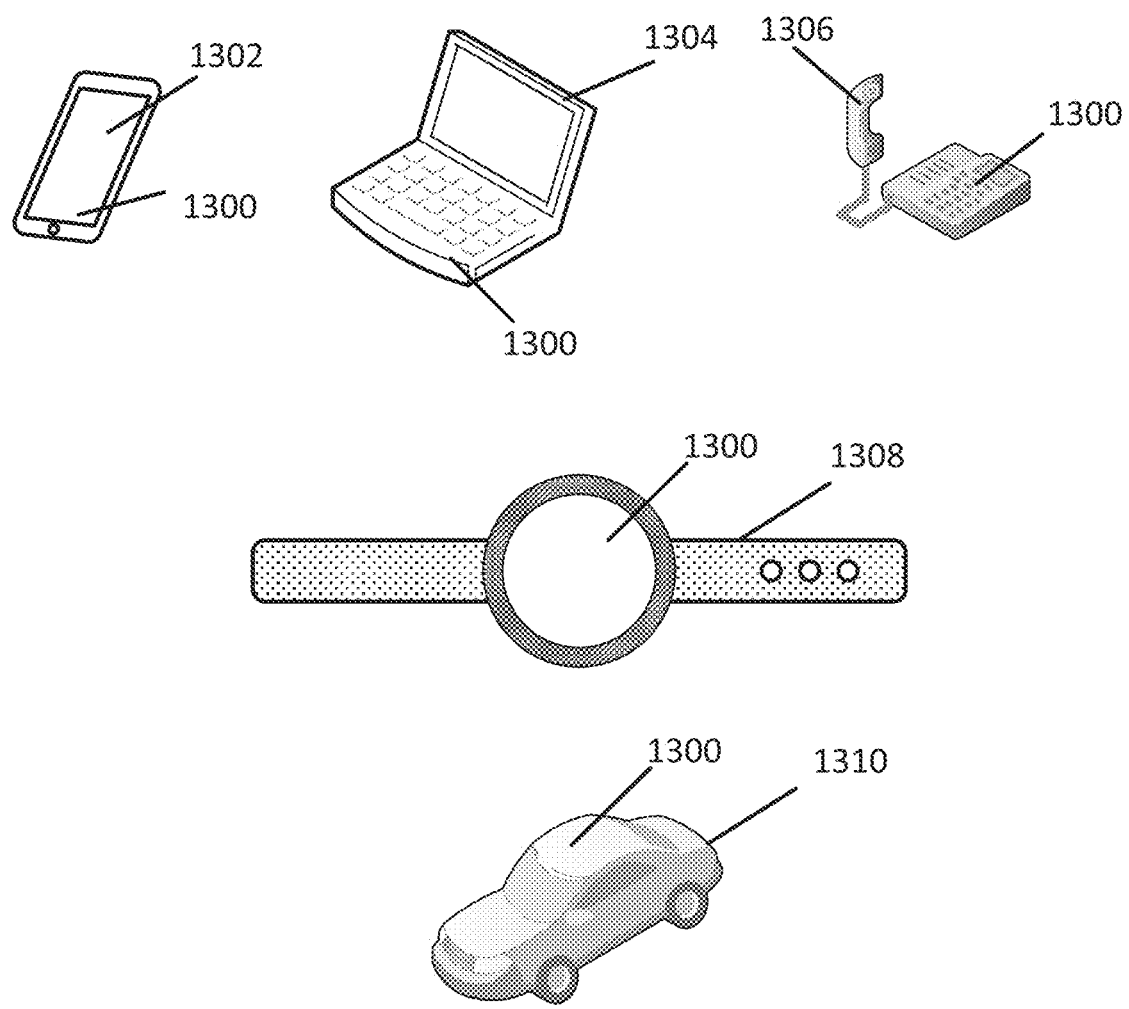
FIG. 13 illustrates various electronic devices that may integrate a die, an electronic circuit, an integrated device, an integrated passive device (IPD), a passive component, a package, and/or a device package described herein.

FIG. 13 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1302, a laptop computer device 1304, a fixed location terminal device 1306, a wearable device 1308, or automotive vehicle 1310 may include a device 1300 as described herein. The device 1300 may be, for example, any of the devices and/or integrated circuit (IC) packages described herein. The devices 1302, 1304, 1306 and 1308 and the vehicle 1310 illustrated in FIG. 13 are merely exemplary. Other electronic devices may also feature the device 1300 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-6, 7A-7B, 8A-8B, 9A-9B, 10, 11A-11B, and/or 12-13 may be rearranged and/or combined into a single component, process, feature or function or embodied in several components, processes, or functions. Additional elements, components, processes, and/or functions may also be added without departing from the disclosure. It should also be noted FIGS. 1-6, 7A-7B, 8A-8B, 9A-9B, 10, 11A-11B, and/or 12-13 and its corresponding description in the present disclosure is not limited to dies and/or ICs. In some implementations, FIGS. 1-6, 7A-7B, 8A-8B, 9A-9B, 10, 11A-11B, and/or 12-13 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. An object that is coupled to another object may be coupled to part of the object or all of the object. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A package comprising a substrate; a first integrated device coupled to the substrate; and a second integrated device coupled to the first integrated device. A portion of the second integrated device overhangs over the first integrated device. The second integrated device is configured to be coupled to the substrate. The second integrated device includes a front side and a back side. The front side of the second integrated device faces the substrate.

Aspect 2: The package of aspect 1, wherein the second integrated device is coupled to the substrate through at least one pillar interconnect.

Aspect 3: The package of aspect 1, wherein the second integrated device is coupled to the substrate through an interposer and at least one solder interconnect.

Aspect 4: The package of aspect 3, wherein the interposer includes a dielectric layer and at least one interposer interconnect.

Aspect 5: The package of aspects 3 through 4, wherein the interposer is located between the substrate and the portion of the second integrated device that overhangs the first integrated device.

Aspect 6: The package of aspects 1 through 5, wherein the second integrated device is coupled to the first integrated device through an adhesive.

Aspect 7: The package of aspects 1 through 6, wherein the first integrated device includes a first front side and a first back side, and wherein the front side of the second integrated device faces the first back side of the first integrated device.

Aspect 8: The package of aspects 1 through 7, wherein the first integrated device is coupled to the substrate through a plurality of solder interconnects.

Aspect 9: The package of aspects 1 through 8, further comprising a third integrated device coupled to the first integrated device, wherein a portion of the third integrated device overhangs over the first integrated device, and wherein the third integrated device is configured to be coupled to the substrate.

Aspect 10: The package of aspect 9, wherein the third integrated device is coupled to the substrate through at least one pillar interconnect, at least one solder interconnect, and/or a interposer.

Aspect 11: An apparatus comprising a substrate; a first integrated device coupled to the substrate; and a second integrated device coupled to the first integrated device. A portion of the second integrated device overhangs over the first integrated device. The second integrated device is configured to be coupled to the substrate. The second integrated device includes a front side and a back side. The front side of the second integrated device faces the substrate.

Aspect 12: The apparatus of aspect 11, wherein the second integrated device is coupled to the substrate through at least one pillar interconnect, at least one solder interconnect, and/or an interposer.

Aspect 13: The apparatus of aspect 12, wherein the interposer includes a dielectric layer and at least one interposer interconnect.

Aspect 14: The apparatus of aspects 12 through 13, wherein the interposer is located between the substrate and the portion of the second integrated device that overhangs the first integrated device.

Aspect 15: The apparatus of aspects 11 through 14, wherein the second integrated device is coupled to the first integrated device through an adhesive.

Aspect 16: The apparatus of aspects 11 through 15, wherein the first integrated device includes a first front side and a first back side, and wherein the front side of the second integrated device faces the first back side of the first integrated device.

Aspect 17: The apparatus of aspects 11 through 16, wherein the first integrated device is coupled to the substrate through a plurality of solder interconnects.

Aspect 18: The apparatus of aspects 11 through 17, further comprising a third integrated device coupled to the first integrated device, wherein a portion of the third integrated device overhangs over the first integrated device, and wherein the third integrated device is configured to be coupled to the substrate.

Aspect 19: The apparatus of aspect 18, wherein the third integrated device is coupled to the substrate through at least one pillar interconnect, at least one solder interconnect, and/or an interposer.

Aspect 20: The apparatus of aspects 11 through 19, wherein the apparatus includes a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 21: A method for fabricating a package. The method provides a substrate. The method couples a first integrated device to the substrate. The method couples a second integrated device to the first integrated device such that a portion of the second integrated device overhangs over the first integrated device. The second integrated device is configured to be coupled to the substrate. The second integrated device includes a front side and a back side. The front side of the second integrated device faces the substrate.

Aspect 22: The method of aspect 21, wherein the second integrated device is coupled to the substrate through at least one pillar interconnect, at least one solder interconnect, and/or an interposer.

Aspect 23: The method of aspects 21 through 22, wherein the second integrated device is coupled to the first integrated device through an adhesive.

Aspect 24: The method of aspects 21 through 23, further comprising forming an encapsulation layer over the substrate.

Aspect 25: The method of aspects 21 through 24, further comprising coupling a third integrated device to the first integrated device, wherein a portion of the third integrated device overhangs over the first integrated device, and wherein the third integrated device is configured to be coupled to the substrate.

Aspect 26: The method of aspect 25, wherein the third integrated device is coupled to the substrate through at least one pillar interconnect, at least one solder interconnect, and/or an interposer.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
   a substrate;
   a first integrated device comprising a first front side and a first back side,
     wherein the first back side includes a first die substrate, and
     wherein the front side of the first integrated device is coupled to a first side of the substrate through a first plurality of solder interconnects;
   an adhesive coupled to the first back side of the first integrated device;
   a second integrated device coupled to the first integrated device through the adhesive,
     wherein a portion of the second integrated device overhangs over the first integrated device,
     wherein the second integrated device is configured to be electrically coupled to the substrate,
     wherein the second integrated device includes a second front side and a second back side,
     wherein the second back side includes a second die substrate, and
     wherein the adhesive directly touches (i) the first back side of the first integrated device and (ii) the second front side of the second integrated device;

an encapsulation layer at least partially encapsulating the first integrated device and the second integrated device, wherein the encapsulation layer is different from the adhesive,
wherein the second integrated device is coupled to the substrate through at least one solder interconnect and at least one pillar interconnect,
wherein the at least one solder interconnect is separate from the first plurality of solder interconnects,
wherein the at least one pillar interconnect is coupled to and touching the substrate, and
wherein the at least one solder interconnect is coupled to and touching the second integrated device and the at least one pillar interconnect.

2. The package of claim 1, further comprising an interposer (i) located vertically between the second integrated device and the substrate, and (ii) located laterally to the first integrated device, and
wherein the second integrated device is coupled to the substrate through the interposer and at least one other solder interconnect that is separate from the first plurality of solder interconnects.

3. The package of claim 2, wherein the interposer includes a dielectric layer and at least one interposer interconnect.

4. The package of claim 2, wherein the interposer is located between the substrate and the portion of the second integrated device that overhangs the first integrated device.

5. The package of claim 1,
wherein the adhesive includes a different material from a solder interconnect from the first plurality of solder interconnects, and
wherein the second front side of the second integrated device is oriented in a direction towards the first side of the substrate.

6. The package of claim 1,
wherein the second integrated device is coupled to the substrate through at least one other pillar interconnect and at least one other solder interconnect,
wherein the at least one other pillar interconnect touches the substrate,
wherein the at least one other solder interconnect touches the at least one other pillar interconnect and the second front side of the second integrated device, and
wherein the at least one other solder interconnect is separate from the first plurality of solder interconnects.

7. The package of claim 1,
wherein the first plurality of solder interconnects are coupled to and touching the first front side of the first integrated device and a plurality of interconnects from the substrate,
wherein the second integrated device is coupled to the substrate through an interposer and at least one other solder interconnect that is separate from the first plurality of solder interconnects, and
wherein the at least one other solder interconnect is coupled to and touching the second front side of the second integrated device.

8. The package of claim 1, further comprising a third integrated device coupled to the first integrated device,
wherein a portion of the third integrated device overhangs over the first integrated device, and
wherein the third integrated device is configured to be electrically coupled to the substrate.

9. The package of claim 8,
wherein the third integrated device is coupled to the substrate through (i) at least one other pillar interconnect, (ii) at least one other pillar interconnect and at least one other solder interconnect, or (iii) an interposer and at least one other solder interconnect, and
wherein the at least one other solder interconnect is separate from the first plurality of solder interconnects.

10. An apparatus comprising:
a substrate;
a first integrated device comprising a first front side and a first back side,
wherein the first back side includes a first die substrate, and
wherein the front side of the first integrated device is coupled to a first side of the substrate through a first plurality of solder interconnects;
a second integrated device coupled to the first integrated device,
wherein a portion of the second integrated device overhangs over the first integrated device,
wherein the second integrated device is configured to be electrically coupled to the substrate,
wherein the second integrated device includes a second front side and a second back side,
wherein the second back side includes a second die substrate, and
wherein the first back side of the first integrated device directly touches the second front side of the second integrated device;
wherein the second integrated device is coupled to the substrate through at least one solder interconnect and at least one pillar interconnect,
wherein the at least one solder interconnect is separate from the first plurality of solder interconnects,
wherein the at least one pillar interconnect is coupled to and touching the substrate, and
wherein the at least one solder interconnect is coupled to and touching the second integrated device and the at least one pillar interconnect,
an encapsulation layer at least partially encapsulating the first integrated device and the second integrated device.

11. The apparatus of claim 10, further comprising an interposer (i) located vertically between the second integrated device and the substrate, and (ii) located laterally to the first integrated device, and
wherein the interposer includes a dielectric layer and at least one interposer interconnect, and
wherein the second integrated device is configured to be electrically coupled to the substrate through the interposer and at least one other solder interconnect that is separate from the first plurality of solder interconnects.

12. The apparatus of claim 11, wherein the interposer is located between the substrate and the portion of the second integrated device that overhangs the first integrated device.

13. The apparatus of claim 10, wherein the first back side of the first integrated device touches the second die substrate of the second front side of the second integrated device.

14. The apparatus of claim 10,
wherein the second integrated device is coupled to the substrate through at least one other pillar interconnect and at least one other solder interconnect,
wherein the at least one other pillar interconnect touches the substrate,
wherein the at least one other solder interconnect touches the at least one other pillar interconnect and the second front side of the second integrated device, and
wherein the at least one other solder interconnect is separate from the first plurality of solder interconnects.

15. The apparatus of claim 10,
wherein the first plurality of solder interconnects are coupled to and touching the first front side of the first integrated device and a plurality of interconnects from the substrate, and
wherein the second front side of the second integrated device is oriented in a direction towards the first side of the substrate.

16. The apparatus of claim 10, further comprising a third integrated device coupled to the first integrated device,
wherein a portion of the third integrated device overhangs over the first integrated device, and
wherein the third integrated device is configured to be electrically coupled to the substrate.

17. The apparatus of claim 16,
wherein the third integrated device is coupled to the substrate through (i) at least one other pillar interconnect, (ii) at least one other pillar interconnect and at least one other solder interconnect, or (iii) an interposer and at least one other solder interconnect, and
wherein the at least one solder interconnect is separate from the first plurality of solder interconnects.

18. The apparatus of claim 10, wherein the apparatus includes a device selected from a group consisting of at least one of: a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

19. A method for fabricating a package, comprising:
providing a substrate;
coupling a first integrated device to the substrate through a plurality of solder interconnects,
wherein the first integrated device comprises a first front side and a first back side,
wherein the first back side includes a first die substrate, and
wherein the first back side of the first integrated device is coupled to a first side of the substrate through the plurality of solder interconnects, and
coupling a second integrated device to the first integrated device such that a portion of the second integrated device overhangs over the first integrated device,
wherein the second integrated device is coupled to the first integrated device through an adhesive,
wherein the second integrated device is configured to be coupled to the substrate,
wherein the second integrated device includes a second front side and a second back side,
wherein the second back side includes a second die substrate, and
wherein the adhesive directly touches (i) the first back side of the first integrated device and (ii) the second front side of the second integrated device;
wherein the second integrated device is coupled to the substrate through (i) at least one pillar interconnect, and (ii) at least one solder interconnect,
wherein the at least one solder interconnect is separate from the first plurality of solder interconnects,
wherein the at least one pillar interconnect is coupled to and touching the substrate, and
wherein the at least one solder interconnect is coupled to and touching the second integrated device and the at least one pillar interconnect,
forming an encapsulation layer that at least partially encapsulates the first integrated device and the second integrated device, wherein the encapsulation layer is different from the adhesive.

20. The method of claim 19,
wherein the adhesive touches the second die substrate of the second front side of the second integrated device, and
wherein the adhesive includes a different material from a solder interconnect from the plurality of solder interconnects.

21. The method of claim 19, wherein the encapsulation layer is coupled to the substrate.

22. The method of claim 19, further comprising coupling a third integrated device to the first integrated device,
wherein a portion of the third integrated device overhangs over the first integrated device, and
wherein the third integrated device is configured to be coupled to the substrate.

23. The method of claim 22, wherein the third integrated device is coupled to the substrate through at least one pillar interconnect, at least one solder interconnect, and/or an interposer.

* * * * *